US012675625B2

US 12,675,625 B2

(12) United States Patent
Song et al.

(10) Patent No.: US 12,675,625 B2
(45) Date of Patent: Jul. 7, 2026

(54) PROTECTING AGAINST EMISSION BASED SIDE CHANNEL DETECTION

(71) Applicant: International Business Machines Corporation, Armonk, NY (US)

(72) Inventors: Peilin Song, Lagrangeville, NY (US); Franco Stellari, Waldwick, NJ (US); Gi-Joon Nam, Chappaqua, NY (US); Jinwook Jung, Somers, NY (US); Victor N. Kravets, White Plains, NY (US); Jagannathan Narasimhan, Mount Kisco, NY (US); Jennifer Kazda, Englewood, NJ (US); Dirk Pfeiffer, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 17/319,286

(22) Filed: May 13, 2021

(65) Prior Publication Data

US 2022/0366113 A1 Nov. 17, 2022

(51) Int. Cl.
*G06F 30/337* (2020.01)
*G06F 30/327* (2020.01)
(Continued)

(52) U.S. Cl.
CPC .......... *G06F 30/337* (2020.01); *G06F 30/327* (2020.01); *G06F 30/3315* (2020.01); *G06F 30/398* (2020.01)

(58) Field of Classification Search
CPC .. G06F 30/327; G06F 30/337; G06F 30/3315; G06F 30/398; G06F 21/75
See application file for complete search history.

(56) References Cited

U.S. PATENT DOCUMENTS 5,381,524 A * 1/1995 Lewis ................. G06F 30/3312
716/108
7,536,665 B1 * 5/2009 Horlick ................. G06F 30/394
716/126

(Continued)

OTHER PUBLICATIONS

Muhammad Yasin, et al. "What to Lock? Functional and Parametric Locking". Proceedings of the on Great Lakes Symposium on VLSI 2017, pp. 351-356. (Year: 2017).*

(Continued)

*Primary Examiner* — Jack Chiang
*Assistant Examiner* — Aric Lin
(74) *Attorney, Agent, or Firm* — CANTOR COLBURN LLP; Anthony Mauricio Pallone

(57) ABSTRACT

Mechanisms are provided for optimizing an integrated circuit device design to obfuscate emissions corresponding to internal logic states of the integrated circuit device design. A first integrated circuit (IC) device design data structure is received and parsed to identify at least one instance of an obfuscation indicator in the data of the IC device design data structure. At least one IC logic element is marked, in the IC device design, which is associated with the at least one instance of the obfuscation indicator. At least one emission obfuscation optimization is applied to the marked at least one IC logic element to obfuscate emissions from the marked at least one IC logic element and generate an emissions obfuscated IC device design data structure. The emissions obfuscated IC device design data structure is output for fabrication of an IC device in accordance with the emissions obfuscated IC device design data structure.

16 Claims, 15 Drawing Sheets

(51) Int. Cl.
       *G06F 30/3315* (2020.01)
       *G06F 30/398* (2020.01)

(56) References Cited

U.S. PATENT DOCUMENTS

| | | | | |
|---|---|---|---|---|
| 7,539,957 | B1 * | 5/2009 | Nagarandal | G01R 31/31813 |
| | | | | 716/136 |
| 8,331,726 | B2 | 12/2012 | Stellari et al. | |
| 8,741,713 | B2 | 6/2014 | Bruley et al. | |
| 9,075,106 | B2 | 7/2015 | Bernstein et al. | |
| 10,147,175 | B2 | 12/2018 | Bahgat Shehata et al. | |
| 10,521,897 | B2 | 12/2019 | Bahgat Shehata et al. | |
| 10,523,433 | B1 | 12/2019 | Monahan et al. | |
| 10,591,539 | B2 | 3/2020 | Stellari et al. | |
| 10,755,397 | B2 | 8/2020 | Stellari et al. | |
| 10,755,404 | B2 | 8/2020 | Lin et al. | |
| 10,878,150 | B1 * | 12/2020 | Savarbaghi | G06F 30/343 |
| 10,895,596 | B2 | 1/2021 | Song et al. | |
| 10,928,448 | B2 | 2/2021 | Stellari et al. | |
| 11,461,520 | B1 * | 10/2022 | Chokhani | G06F 30/398 |
| 11,663,382 | B1 * | 5/2023 | Cascioli | G06F 30/33 |
| | | | | 703/15 |
| 2001/0032067 | A1 * | 10/2001 | Nemani | G06F 30/327 |
| | | | | 703/2 |
| 2002/0184600 | A1 * | 12/2002 | Sachs | G06F 30/30 |
| | | | | 716/124 |
| 2011/0055581 | A1 * | 3/2011 | Chevallier-Mames | |
| | | | | H04L 9/3236 |
| | | | | 713/181 |
| 2011/0156167 | A1 * | 6/2011 | Kornachuk | G06F 30/3312 |
| | | | | 257/E27.059 |
| 2014/0040843 | A1 * | 2/2014 | Postman | G06F 30/39 |
| | | | | 716/112 |
| 2014/0258958 | A1 * | 9/2014 | Fifield | G06F 30/327 |
| | | | | 716/115 |
| 2017/0132351 | A1 * | 5/2017 | Buehler | G06F 30/394 |
| 2018/0075172 | A1 * | 3/2018 | Dudha | G06F 30/30 |
| 2018/0301426 | A1 | 10/2018 | Savidis et al. | |
| 2018/0350062 | A1 * | 12/2018 | Adato | G06T 7/0002 |
| 2019/0042688 | A1 * | 2/2019 | Yanamadala | G06F 30/327 |
| 2019/0311156 | A1 | 10/2019 | Tehranipoor et al. | |
| 2021/0224452 | A1 * | 7/2021 | Lin | G06F 30/33 |
| 2022/0019720 | A1 * | 1/2022 | Bhunia | G06F 30/327 |

OTHER PUBLICATIONS

H. Ma, J. He, Y. Liu, L. Liu, Y. Zhao and Y. Jin, "Security-Driven Placement and Routing Tools for Electromagnetic Side-Channel Protection," in IEEE Transactions on Computer-Aided Design of Integrated Circuits and Systems, Sep. 2020 (Year: 2020).*

Ash-Saki, Abdullah et al., "How Multi-threshold Designs Can Protect Analog IPs", 2018 IEEE 36th International Conference on Computer Design (ICCD), IEEE, Oct. 7-10, 2018, 8 pages.

De, Asmit et al., "Preventing Reverse Engineering using Threshold Voltage Defined Multi-Input Camouflaged Gates", 2017 IEEE International Symposium on Technologies for Homeland Security (HST), IEEE, Apr. 25-26, 2017, 6 pages.

Song, Peilin et al., "Counterfeit IC Detection using Light Emission", International Test Conference (ITC), Oct. 20-23, 2014, 8 pages.

Song, Peilin et al., "MARVEL—Malicious Alteration Recognition and Verification by Emission of Light", IEEE Int. Symposium on Hardware-Oriented Security and Trust (HOST), Jun. 5-6, 2011, 5 pages.

Song, Peilin et al., "Tester-Based Optical and Electrical Diagnostic System and Techniques", Proc. of VLSI Test Symposium (VTS), Apr. 23-25, 2012, 6 pages.

Stellari, Franco et al., "Broken Scan Chain Diagnostics based on Time-Integrated and Time-Dependent Emission Measurements", Proceedings from the 30th International Symposium for Testing and Failure Analysis, Nov. 14-18, 2004, 6 pages.

Stellari, Franco et al., "Functional Block Extraction for Hardware Security Detection using Time-Integrated and Time-Resolved Emission Measurements", Proc. VLSI Test Symposium, Apr. 13-17, 2014, 6 pages.

Stellari, Franco et al., "Revealing SRAM Memory Content using Spontaneous Photon Emission", 2016 IEEE 34th VLSI Test Symposium (VTS), Apr. 25-27, 2016, 6 pages.

Stellari, Franco et al., "Techniques for Reverse Engineering and Functionality Extraction of Mixed-Signal ICs for Security Applications", Proc. of International Symposium for Testing and Failure Analysis (ISTFA), Nov. 1-5, 2015, 10 pages.

Stellari, Franco et al., "Verification of Untrusted Chips using Trusted Layout and Emission Measurements", IEEE International Symposium on Hardware-Oriented Security and Trust (HOST), May 6-7, 2014, 6 pages.

Yasin, Muhammad et al., "Evolution of Logic Locking", 2017 IFIP/IEEE International Conference on Very Large Scale Integration (VLSI-SoC), Oct. 23-25, 2017, 7 pages.

Yasin, Muhammad et al., "On Improving the Security of Logic Locking", IEEE Transactions on Computer-Aided Design of Integrated Circuits and Systems 36.9 (2015), Dec. 22, 2015, 14 pages.

* cited by examiner

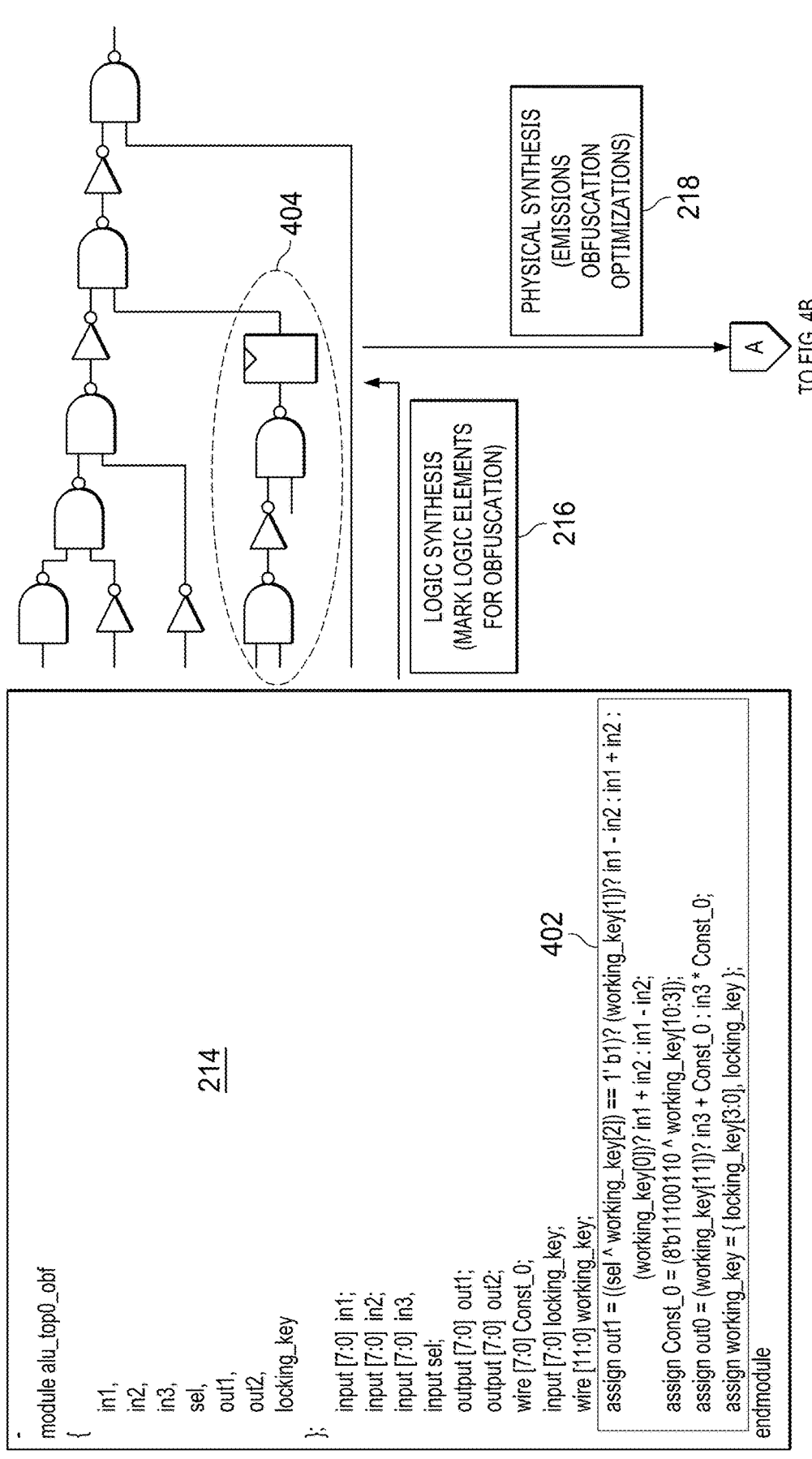

module alu_top0_obf
{
  in1,
  in2,
  in3,
  sel,
  out1,
  out2,
  locking_key
};

input [7:0] in1;
  input [7:0] in2;
  input [7:0] in3;
  input sel;
  output [7:0] out1;
  output [7:0] out2;
  wire [7:0] Const_0;
  input [7:0] locking_key;
  wire [11:0] working_key;

assign out1 = ((sel ^ working_key[2]) == 1' b1)? (working_key[1])? in1 - in2 : in1 + in2 :
                (working_key[0])? in1 + in2 : in1 - in2;
  assign Const_0 = (8'b11100110 ^ working_key[10:3]);
  assign out0 = (working_key[11])? in3 + Const_0 : in3 * Const_0;
  assign working_key = { locking_key[3:0], locking_key };
endmodule

214

402

LOGIC SYNTHESIS
(MARK LOGIC ELEMENTS
FOR OBFUSCATION)

216

PHYSICAL SYNTHESIS
(EMISSIONS
OBFUSCATION
OPTIMIZATIONS)

FROM FIG. 4A

PROTECTING AGAINST EMISSION BASED SIDE CHANNEL DETECTION

BACKGROUND

The present application relates generally to an improved data processing apparatus and method and more specifically to mechanisms for optimizing integrated circuit designs to protect the integrated circuits from emission based side channel detection of internal states of the integrated circuit elements. In addition, the present application relates to a design structure for an integrated circuit device in which emissions of logic elements of the integrated circuit device are obfuscated by emission obfuscation optimizations in the integrated circuit device design.

The protection of intellectual property in the design and manufacture of integrated circuits is an increasingly important issue as the integrated circuit supply chain becomes more globalized. That is, the supply chain of integrated circuits is increasingly being outsourced such that the integrated circuit design often is performed by a first entity, but the fabrication of the integrated circuit devices themselves based on the integrated circuit design is outsourced to a different second entity. As a result, trust between the parties involved is of increased concern and the distribution of the integrated circuit supply chain provides opportunities for untrusted entities to gain unauthorized access to elements of the integrated circuit design that are intended to stay proprietary.

Logic or function locking techniques are increasingly popular techniques employed to help secure integrated circuit designs from piracy, reverse engineering, and other such attacks on the significant investment that companies make in integrated circuit designs. Logic or function locking involves the insertion of additional logic, e.g., XOR key gates or the like, into a circuit which locks the original integrated circuit design with a secret key. Usually, an on-chip tamper-proof memory stores the secret key or the secret key can be uploaded through a scan chain during chip bootup and stored in latches or flip-flops. The locked circuit includes additional inputs for receiving the secret key from the on-chip tamper-proof memory or above mentioned latches/flip flops. Thus, by requiring that the secret key be provided in order to unlock the logic of the locked circuit, the functionality of the locked circuit may be secured, i.e., the integrated circuit will generate incorrect results unless the secret key is provided to unlock the locked circuit.

As a result, the integrated circuit design details are obfuscated by the logic locking and cannot be reversed engineered. Thus, the resulting locked netlist for the integrated circuit design may be provided to downstream elements of the integrated circuit supply chain. The other parties involved in the integrated circuit supply chain can access the locked netlist for fabrication purposes, but are not able to unlock the design since they are not given access to the secret key. It is only after the secret key is loaded into the on-chip memory that the integrated circuit device has the necessary secret key information needed to unlock the locking logic and enable full and correct functioning of the integrated circuit device.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method is provided for optimizing an integrated circuit device design to obfuscate emissions corresponding to internal logic states of the integrated circuit device design. The method comprises receiving a first integrated circuit (IC) device design data structure specifying an IC device design. The method further comprises parsing the IC device design data structure to identify at least one instance of an obfuscation indicator in the data of the IC device design data structure. The method also comprises marking at least one IC logic element, in the IC device design, which is associated with the at least one instance of the obfuscation indicator. In addition, the method comprises applying at least one emission obfuscation optimization to the marked at least one IC logic element, in the IC device design, to obfuscate emissions from the marked at least one IC logic element and generate an emissions obfuscated IC device design data structure. Moreover, the method comprises outputting the emissions obfuscated IC device design data structure for fabrication of an IC device in accordance with the emissions obfuscated IC device design data structure.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 4A and 4B depict a conceptual diagram of a design flow of an integrated circuit design through the obfuscation optimization logic of an optical obfuscation optimization engine according to one illustrative embodiment;

DETAILED DESCRIPTION

Figures 1, 1A:
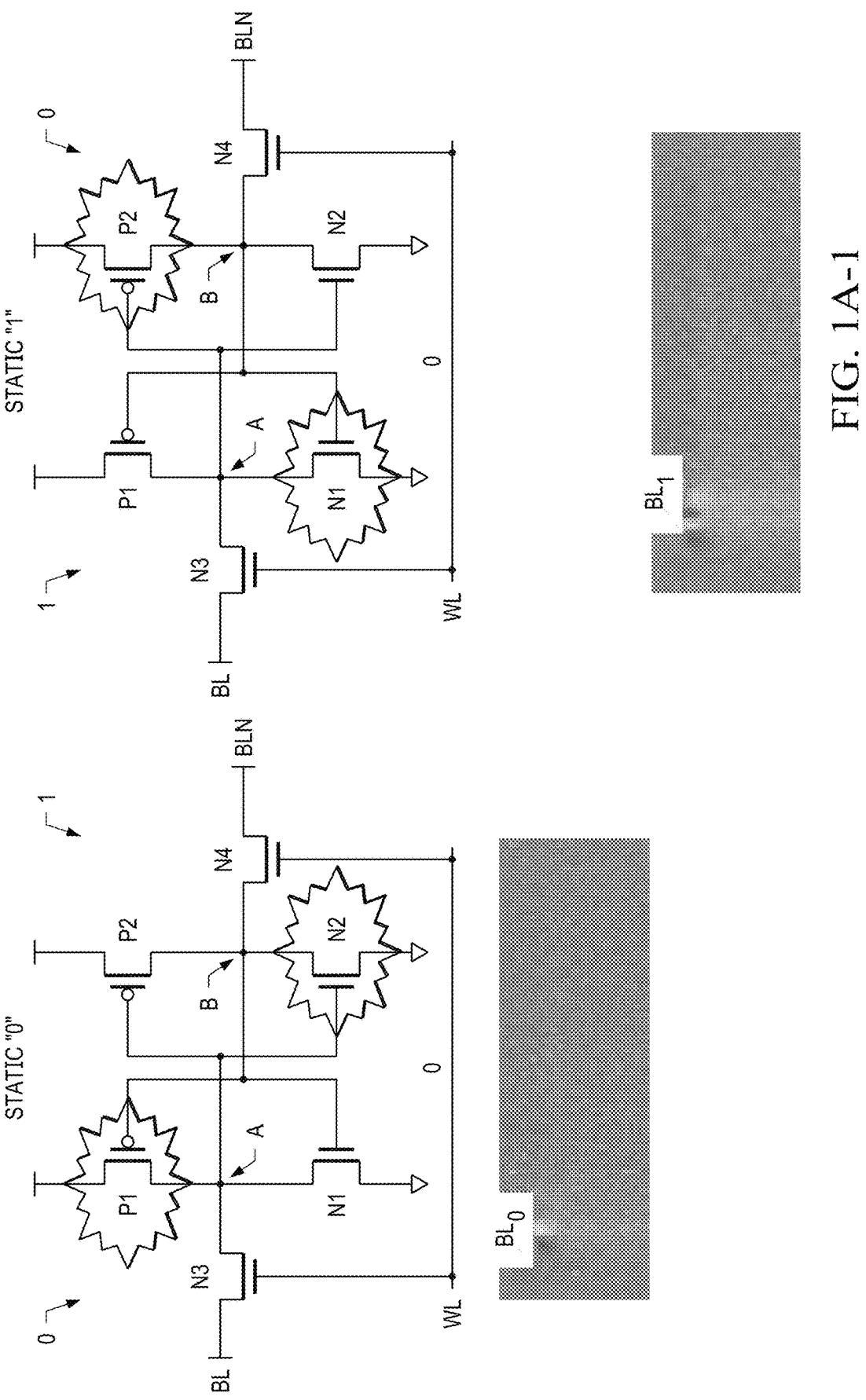
FIGS. 1A-1 and 1A-2 show a depiction of an example optical based side-channel detection technique for reading the contents of an SRAM using static photon emission (PEM)

As mentioned above, logic or function locking is increasingly of interest in protecting integrated circuit (IC) designs during the IC supply chain process from design integration, register-transfer level (RTL) netlist generation, RTL verification, logic synthesis, gate level netlist generation, physical synthesis, layout, and layout verification, to fabrication, testing, packaging and assembly. Logic or function locking is popular because it is generally effective at all stages of the IC supply chain up to the point at which the on-chip storage element, such as a memory or latch/flip-flop, is loaded with the secret key that then may be used to unlock the locking logic of the IC device.

As untrusted entities are aware that the secret key is stored in the on-chip storage element, once the on-chip storage element is loaded with the secret key, the untrusted entities (attackers) may target their attempts to detect the secret key on the circuit pathway from the on-chip storage element to the locked circuit elements, i.e., the secret key path. Attackers may use side-channel detection techniques, such as spontaneous photon emission, laser probing, laser stimulation, metal reflectivity detection, focused ion beam (FIB) based detection, nanoprobing, and the like, to discover the internal state or other characteristics of the IC device circuit elements and from that, determined the data being stored in storage elements and/or passed from circuit element to circuit element. In particular, advances in non-destructive logic probing techniques, such as optical probing techniques, attackers are able to gather characteristic information about the states of circuit elements over time within the IC device which may reveal the secret key.

For example, it has been determined that spontaneous photon emission may be used to reveal SRAM memory content. It has also been determined that measured emission signatures can be matched against predicted signatures to identify the gate logic state. Moreover, it has been determined that detecting the state of intermediate buffers can be used to read a scan chain state. Thus, various non-destructive techniques have been employed to perform side channel detection of characteristic information of the states of logic elements within an IC device.

By employing such side-channel detection techniques to gather information about characteristics of the secret key path, the secret key itself may be discovered by attackers. For example, detecting the SRAM memory contents may reveal the secret key stored therein. Moreover, detecting the states of scan chains or the emission signatures of gate logic along the secret key path may likewise reveal the secret key. Therefore, there is a need for improved mechanisms, such as improved computing tools for designing ICs, and improved IC devices themselves that are fabricated as a result of improved IC designs, which obfuscate the secret key path from such side channel detection techniques. More specifically, there is a need for improving security of IC devices, and specifically the secret key path circuitry of IC devices, from emission based side channel detection techniques.

The illustrative embodiments provide mechanisms for obfuscating designated portions of an IC design from photon emission based side channel detection techniques, laser-based techniques such as electro-optical frequency mapping (EOFM)/laser voltage imaging (LVI), or the like. In general, these will be referred to herein as optical side channel attacks, with emission based side channel detection techniques being used as one example for describing the mechanisms of the illustrative embodiments. It should be appreciated what while photon emissions based side channel detection techniques are referenced herein for purposes of illustration, the illustrative embodiments are not limited to such and the mechanisms of the illustrative embodiments may be implemented to obfuscate IC designs and IC elements from any emissions based side channel detection techniques and/or any optical side channel attacks. For example, while light or photon emission based side channel detection techniques and other optical detection techniques may be referenced herein, it can be appreciated that the mechanisms of the illustrative embodiments may be implemented with other types of emissions generated by IC circuitry and devices which may be representative of the internal state of the IC circuitry and devices.

The mechanisms of the illustrative embodiments provide logic for identifying indicators of obfuscation in the design description of the integrated circuit design, e.g., indicators in the hardware description language (HDL) of the register-transfer level (RTL) abstraction of the integrated circuit (IC) design, such as in Verilog, SystemVerilog, VHDL, or the like. The indicators of obfuscation specify portions of the IC design that are intended to be obfuscated from external access or observation through various detection techniques. The indicators themselves may take many different forms, but in some illustrative embodiments may be specific alphanumeric portions of the hardware description language that reference obfuscated elements or references to elements whose state is intended to be non-discoverable, such as "working_key", "locking_key", etc., for example.

The identification of the indicators of obfuscation is used during logic synthesis (mapping RTL to gate-level netlist) to mark, such as through a coloring and marking operation, the IC logic elements and paths corresponding to the indicators of obfuscation, i.e., the circuit paths intended to be obfuscated (referred to herein as obfuscated paths). For example, in some illustrative embodiments, the obfuscated path is the secret key path comprising the logic gates, flip-flops/latches, and the like connecting the on-chip storage elements with the locked IC logic elements.

Based on the marked IC logic elements that are part of an obfuscated path, mechanisms are provided for performing optimizations of the IC design during physical synthesis (mapping of RTL to physical chip). That is, the illustrative embodiments provide an obfuscation layout synthesis engine, which is executed during logic and/or physical synthesis, that implements obfuscation optimizations based on the marked portions of the IC design, e.g., the marked storage elements, path, and gates of the secret key path. These optimizations are specifically directed to obfuscating the obfuscation marked/colored IC logic elements along the obfuscated path from side channel detection of the internal states of these IC logic elements, such as, for example, emission based side channel detection. The obfuscation optimizations may take a variety of different forms depending on the physical constraints of the IC design.

For example, these optimizations may include special placement of the marked IC logic elements, e.g., logic gates, flip-flops, etc. into high density regions of the IC design. Other optimizations may include special placement of the marked IC logic elements next to larger devices in the IC design whose emissions will obfuscate the emissions of the marked IC logic elements. Still other optimizations may include threshold voltage assignments of marked IC logic elements to a relatively higher threshold voltage, which in turn lowers emissions of the marked IC logic element. In yet other optimizations, special path-based optimizations of the obfuscated path and corresponding marked IC logic elements may be performed to avoid or reduce state dependent emission signature changes (intensity/shape).

It should be appreciated that various ones and/or combinations of these optimizations may be utilized. The particular optimizations utilized in any specific implementation may be based on a tradeoff between various design constraints such as security, power consumption, performance, and the like. This tradeoff may be dependent upon the intended implementation of the IC design. For example, for IC designs intended to be used in military or other sensitive government applications, security may be the overriding concern and thus, all optimizations may be implemented. In other cases, such as commercial uses, the IC design optimizations may prioritize performance and/or power consumption over security such that a smaller sub-set of one or more optimizations, less than all the available optimizations, may be selected for use. Based on the specified priorities for the IC design, such as in input received or through configuration data, various ones of the optimizations may be enabled or disabled.

Following application of the obfuscation optimizations by the mechanisms of the illustrative embodiments, a modified IC design is generated having a corresponding modified RTL and modified physical layout of the IC device, modified from the original design to obfuscate the emissions of the marked IC device elements, such as the secret key path. The modified IC design may then be provided for subsequent stages of the IC design/manufacture pipeline, such as physical verification, layout post processing, fabrication, and packaging and testing. As a result, a physical IC device is generated that is secured against side-channel detection of the internal states of sensitive internal paths of the IC device, such as via optical/emissions based side-channel detection techniques. Thus, for example, in the case of an IC device having locked logic/functionality, the secret key storage and secret key path may be secured against optical/emission based side-channel detection techniques such that the secret key may be maintained secure. This prevents unauthorized parties (attackers) from gaining access to the secret key and thus, helps avoid the issues present in the IC device supply chain noted above.

Before continuing the discussion of the various aspects of the illustrative embodiments and the improved computer operations performed by the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on hardware to thereby configure the hardware to implement the specialized functionality of the present invention which the hardware would not otherwise be able to perform, software instructions stored on a medium such that the instructions are readily executable by hardware to thereby specifically configure the hardware to perform the recited functionality and specific computer operations described herein, a procedure or method for executing the functions, or a combination of any of the above.

The present description and claims may make use of the terms "a", "at least one of", and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Moreover, it should be appreciated that the use of the term "engine," if used herein with regard to describing embodiments and features of the invention, is not intended to be limiting of any particular implementation for accomplishing and/or performing the actions, steps, processes, etc., attributable to and/or performed by the engine. An engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular engine is, unless otherwise specified, for purposes of convenience of reference and not intended to be limiting to a specific implementation. Additionally, any functionality attributed to an engine may be equally performed by multiple engines, incorporated into and/or combined with the functionality of another engine of the same or different type, or distributed across one or more engines of various configurations.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figures 1, 1A, 2:
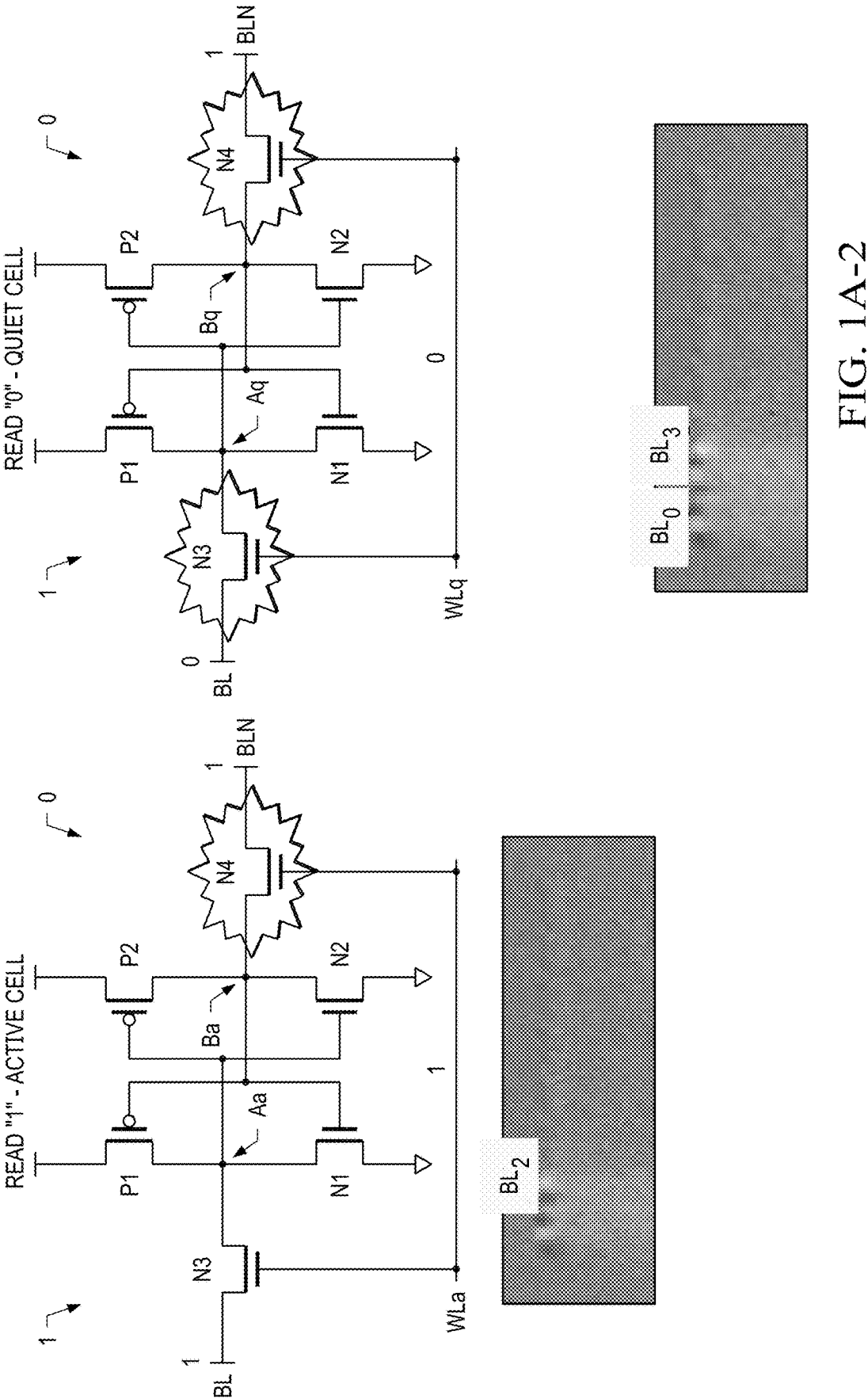

As noted above, optical based side-channel attacks, such as photon emissions based side-channel attacks, electro-optical frequency mapping (EOFM)/Laser Voltage Imaging (LVI), and the like, have become more effective with the advancement of non-destructive probing techniques. Optical based side-channel attacks pose a significant problem in the IC device supply chain since such techniques make it possible to access internal state information for a secured IC device, such as an IC device that implements logic/function locking. FIGS. 1A-1 and 1A-2 show a depiction of an example optical based side-channel detection technique for reading the contents of an SRAM using static photon emission (PEM). Through such techniques, using repeated reading operations, individual cell contents can be detected.

In general, complementary metal-oxide semiconductor (CMOS) gates emit a very faint near-infrared light in both quiescent and switching conditions. Referring to a simple complementary inverter, different logic states and switching events generate different types of emission signatures. For example, when the output of an inverter is at a logic high level, the n field effect transistor (FET) produces light emission from off-state leakage current (LEOSLC, or off—state leakage emission), while the p FET does not emit any light. On the other hand, when the output of the inverter is at logic low level, the p FET will emit light with the n FET not emitting any light. If the logic state of the gate is toggled, a short burst of hot-carrier luminescence will also be emitted by either the n or p FET.

A six transistor (6T) static random-access memory (SRAM) cell uses a bistable latching circuitry, consisting of two inverters connected into a loop to store a bit of data. Additionally, two pass-gates (or access transistors) are used to read and write the cell content. Referring to the cell schematic in FIGS. 1A-1 and 1A-2, assume that a logic bit "0" corresponds to a condition where node A is at ground and node B is at Vdd, while a logic bit "1" correspond to the opposite condition. In a quiescent logic "0" state, transistors P1 and N2 experience off-state leakage current and have a corresponding faint emission. At the same time, N1 and P2 have their Vds voltage close to zero (Ohmic state), thus not emitting any light. On the other hand, when the content of the cell is "1", transistors P2 and N1 produce off-state leakage emission, while P1 and N2 are dark (do not emit any light).

Since p FET emission is usually fainter than n FET emission, as a first approximation, the p FET emission can be neglected. Therefore, one can think of detecting the cell content by determining the relative emission of transistors N1 versus N2. For example, if the emission intensity of N1 is brighter than the one from N2, then a logic "1" is observed. Although this technique does not allow to read the entire memory content when it is not changing, it allows to detect single cell changes from one quiescent state to the next by acquiring emission in each state of interest and applying differential imaging processing.

Referring again to the diagram in FIGS. 1A-1 and 1A-2, in addition to the emission from the inverters at the core of the SRAM cell, spontaneous photon emission is also generated from the pass-gates connecting the cell to the two bitlines (BLs). In the quiescent state both BL and BLN have, in general, an intermediate voltage between Vdd and ground. For this reason, both N3 and N4 will experience a Vds voltage less than Vdd while the wordline (WL) keeps the transistors off. Although a small amount of off-state leakage flows through the pass gates, the low voltage across them generates an extremely faint (undetectable) emission signature (emission intensity has exponential dependency on Vds). However, a different situation occurs during a read operation of a cell.

Assume that WLa is the active WL (i.e., WLa=1), and WLq is one of the inactive WLs (i.e., WLq=0). Then cells connected to WLa are expected to generate a bright emission signal from either N3 or N4 because the pass-gate is conducting current to charge and discharge BL and BLN. However, an additional emission signal modulation is expected from the pass-gates of other quiescent cells (WLq=0) connected to the same BL and BLN. In fact, the pass gates of a cell connected to WLq is expected to produce a brighter emission signature if its content is opposite to the one of the cell being read by WLa. More specifically, assume that the cell being read during WLa activation contains a logic "0", so that BL will be pulled to ground while BLN will move towards Vdd. At the same time of the read, it is expected that the emission from a quiescent cell connected to WLq and to the same BL/BLN will become brighter if its content is a logic "1", and to stay dim (or become dimmer) if its logic state is "0". In fact, if the content of the quiescent cell is also logic "0", then Aq is close to ground and Bq is close to Vdd. This causes a further reduction of voltage across the pass gates of the quiescent cell, thus causing an even further reduction of its already faint emission. On the other hand, if the content of the quiescent cell is a logic "1", then Aq is close to Vdd and Bq is close to ground. In this case, the change in voltage on BL and BLN caused by the active cell increases the Vds voltage across the pass gates of the quiescent cell. In turn, this causes an exponential increase in its emission.

Based on the previous analysis, one can understand that the content of the entire memory block of cells with common BL/BLN can be revealed optically every time any of the WLs in the same block are activated for reading. In particular, each cell will show a brighter emission signature if its content (state) is opposite to the cell content of the cell being read by WLa. In addition to memory content detection, emission detection is very effective for detecting functional activity in the memory array. Specifically, read and write activity at specific WLs can be easily monitored with both time-integrated and time-resolved emission measurements of either the WL drivers or the memory array itself. This can be used to identify memory locations that are accessed during specific chip operations, possibly in combination with the capability of reading the corresponding memory cell content.

Figure 1B:
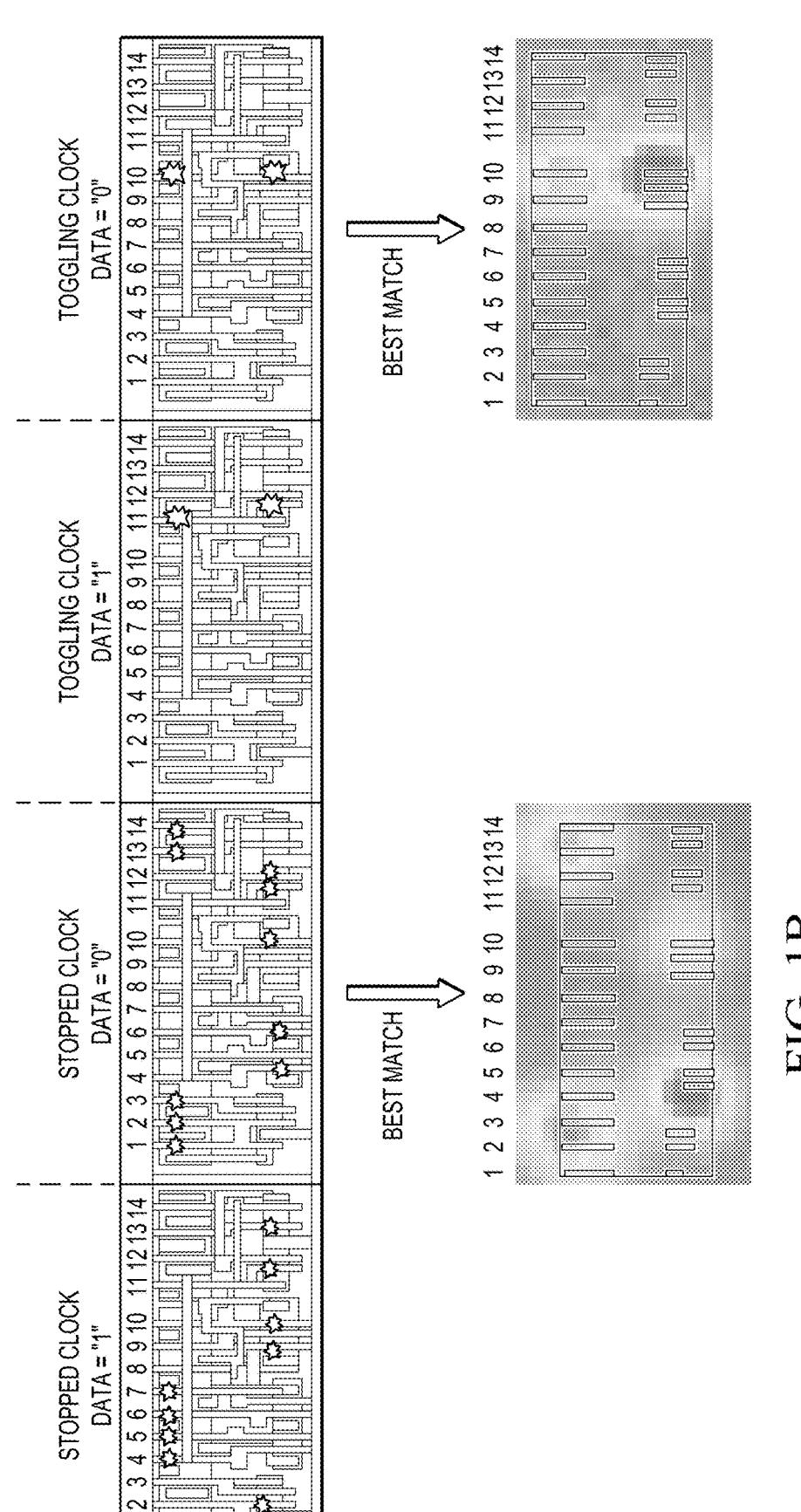
FIG. 1B shows another example of an emission based side-channel detection technique, specifically an example of a PEM based side-channel detection technique, in which the state of a flip-flop may be detected from its emission signature.

FIG. 1B shows another example of an optical based side-channel detection technique, and specifically an example of a photon emission based side-channel detection technique, in which the state of a flip-flop may be detected from its emission signature. In this example, the measured emission signatures of the flip-flop state can be detected and automatically matched against predictive signatures to identify the gate logic state.

The emission signatures can be obtained by analyzing logic states stored in the flip-flop. These emission signatures can be used effectively on segmented emission images. Referring to the flip-flop macro shown in FIG. 1B, the difference between the emission signatures when the flip-flop macro is being clocked while keeping its input at "1" (a) and "0" (b) are depicted. By comparing the measured emission (c) to the two predictive emission images, one can identify the logic state at the input of the flip-flop to be a "0". FIG. 1B shows also a quiescent/stationary condition for the same flip-flop macro. In this case, the measured LEOSLC (f) is compared to the predictive emission signatures of the flip-flop in its two possible logic states. Given the differences between the two predictive images, it can be recognized that, in this case, the flip-flop is in a logic "0" state (e). By acquiring the emission signature of the same macro with different patterns and exercisers, it is possible to make sure that the macro of interest assumes only valid transient and quiescent states, thus rules out possible physical alterations. Furthermore, since emission can be used to effectively monitor logic states and trace transitions non-invasively, one can also identify unexpected transitions.

Figure 1C:
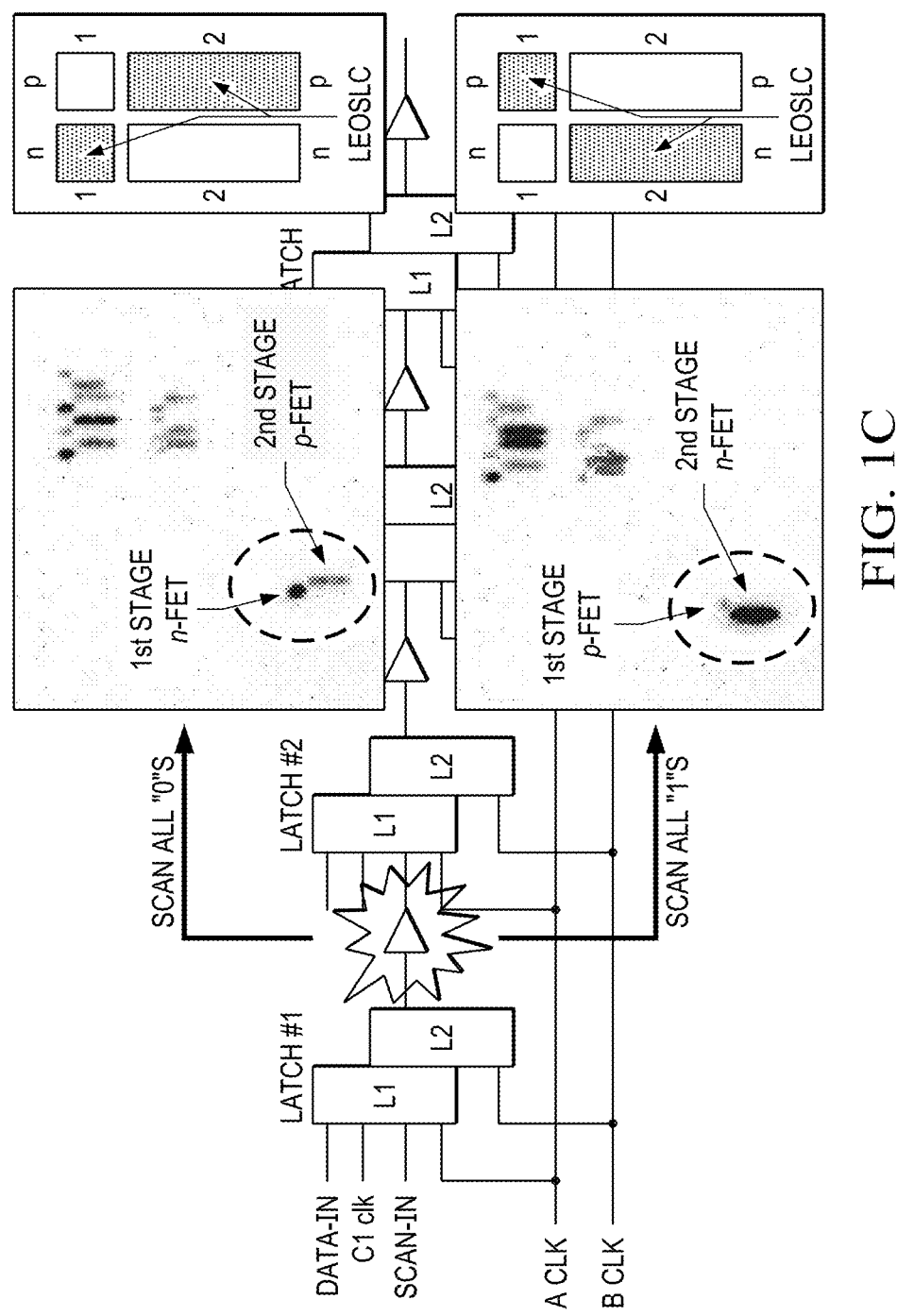
FIG. 1C shows an example of an intermediate buffer emissions based technique for detecting the state of internal IC device circuit elements which can then reveal sensitive data.

FIG. 1C shows yet another optical, e.g., emissions, based technique for detecting the state of internal IC device circuit elements which can then reveal sensitive data. In this example, it is assumed that the IC design is designed for testing and thus, uses scan chains to make it easier to set and observe the flip-flops in the IC design. As shown in FIG. 1C, scan chain state can be read from intermediate buffers. The logic state of the flip-flop can be easily derived from the buffer (shown on the right side of FIG. 1C). For example, on the top right of FIG. 1C, logic "0" can be observed from the emission signature (emission=white color on the first n FET and empty emission from p FET.) Similarly, logic "1" can be observed from the emission signature of the right bottom of FIG. 1C.

Figure 2A:
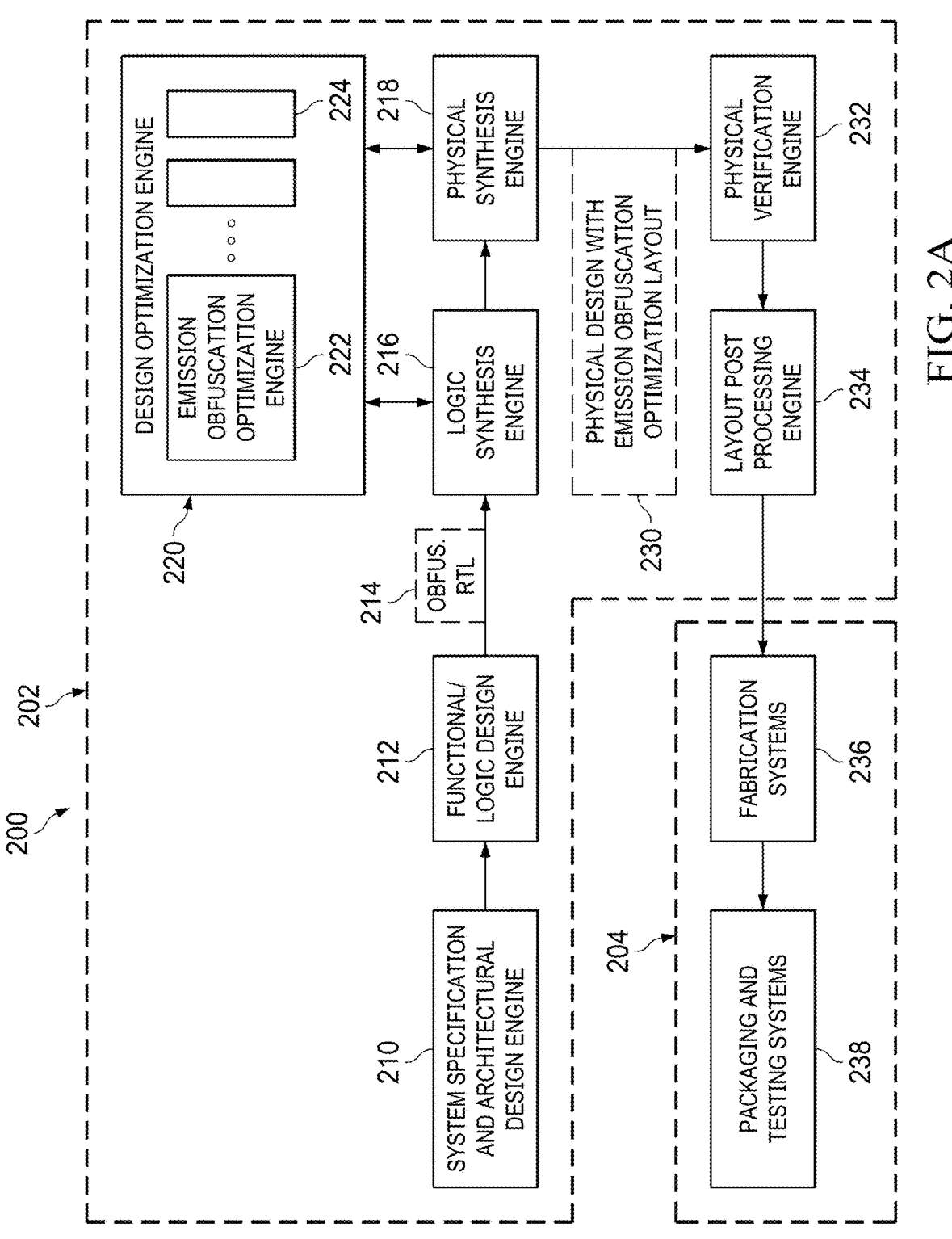
FIG. 2A is an example block diagram of an optical obfuscation optimization integrated circuit design tool in accordance with one illustrative embodiment.

FIG. 2A is an example block diagram of an emission obfuscation optimization integrated circuit design tool in accordance with one illustrative embodiment. It should be appreciated that the block elements 210-234 shown in FIG. 2A are implemented by specialized computer tools that are specifically configured to perform operations for performing their corresponding parts of an integrated circuit (IC) design and fabrication process. Block elements 236-238 represent the fabrication and packaging/testing performed on the fabricated IC devices, i.e., IC chips, and may involve various IC fabrication, packaging, and testing systems generally known in the art. Thus, each block 210-234 of FIG. 2A comprises a combination of hardware and software elements performing their various assigned operations to facilitate the designing of an IC device design for eventual fabrication, packaging, and testing in blocks 236-238. It should be appreciated that while FIG. 2A attempts to represent the IC design and fabrication, packaging, and testing process as a sequential process, in reality some of the separate operations of the various engines may be less sequential and may be performed out of order with regard to the depiction. In general, however, the IC design computer tools 202 and operations are executed/performed prior to the fabrication, packaging, and testing tools 204 and operations.

As shown in FIG. 2A, the IC design process of an emission obfuscation optimization IC design and fabrication system 200 comprises a system specification and architectural design engine 210 and functional/logic design engine 212 through which designers define product requirements, such as may be provided in a product requirements document, followed by the specification of fundamental structure and goals of the product in an architectural specification. Architecture and microarchitecture design teams may be involved in generating the specifications needed to agree on a system design. After architecture and microarchitecture design specifications have been generated, register-transfer level (RTL) designers may interface with logic design tools to convert the architecture/microarchitecture specifications into gate level descriptions or functional models in a hardware description language, such as Verilog, VHDL, and the like. The RTL designs take a function based architectural description and generate hardware models of components on the IC device working together. A resulting RTL code is generated which serves as a basis for performing emissions obfuscation optimization operations of the IC design.

As part of this process of generating the RTL code from the architectural specification, secure IC logic elements and paths in the IC design may be specified by using predefined secure IC logic element/path indicators, e.g., tags, recognized terms, phrases, alphanumeric indicators, or the like, that specify portions of the IC design to be secure and intended to be obfuscated from external access or otherwise specify portions of the IC design that themselves are designed to prevent access to other portions of the IC design, e.g., a secret key storage, path, and locked logic. As the RTL code that is generated as a result has indicators in the code itself of portions of the IC design that are to be kept secure, the RTL code is considered obfuscated RTL code 214. In accordance with the illustrative embodiments, as described herein, the secret key storage elements and associated paths identified in the RTL code may be specified and the placement and routing algorithms, augmented with the mechanisms of the illustrative embodiments, will automatically place these elements in a configuration that results in these elements being hidden from emission/optical side channel detection techniques.

The obfuscated RTL code 214 is provided to a logic synthesis engine 216 which performs logic synthesis operations to convert the obfuscated RTL code 214 into a gate level design. As part of the logic synthesis operation, the logic elements, e.g., gates, latches, flip-flops, buffers, etc. along paths in the obfuscated RTL code 214 that are associated with the predefined obfuscation indicators are identified. For example, in the case of a secret key pathway in the IC design, the RTL code may use indicators specifying the secret key pathway, such as "working_key", "locking_key", or the like. As part of the logic synthesis operation performed by the logic synthesis engine 216, the emission obfuscation optimization engine 222 performs a marking or coloring of logic and pathways to thereby specify which logic elements and/or pathways need to be considered for further optical/emission obfuscation optimizations. For example, the emission obfuscation optimization engine 222 parses the obfuscated RTL code 214 and identifies instances of these predefined obfuscation indicators. The corresponding colored elements may then be processed with optimizations to reduce their susceptibility to optical/emissions based side-channel detection techniques.

The design optimization engine 220 comprises the emission obfuscation optimization engine 222, along with other possible optimization engines 224. The other optimization engines 224 may apply various types of optimizations to the IC design specified in the obfuscated RTL code 214 through the logic synthesis engine 216. The emission obfuscation optimization engine 222 operates to apply emission obfuscation optimizations in accordance with one or more of the illustrative embodiments, as described herein, during the logic synthesis and physical synthesis of the IC design process comprising blocks 216-218. The emission obfuscation optimization engine 222 comprises logic to further apply one or more emission obfuscation optimizations to the logic and/or physical layout of the IC design in order to obfuscate the emissions of the marked/colored portions of the IC design, i.e., the marked/colored logic elements and pathways. The particular optimizations applied will depend on the design constraints, e.g., tradeoffs between performance, security, and the like, as specified by user inputs, configuration parameters, or the like, and will also depend on the particular logic elements and pathways present in the IC design.

The emissions obfuscation optimizations modify the IC design so as to include additional logic elements, rearrange existing logic elements, or otherwise modify placement of logic elements and pathways in the IC design so as to obfuscate the emissions of the marked/colored logic elements and pathways. The obfuscation makes it so that the emissions from the marked/colored logic elements and pathways are not clearly distinguishable external to the IC device. Thus, optical and emissions based side-channel detection techniques or attacks are rendered unsuccessful. These emissions obfuscation optimizations may be performed as part of the logic synthesis and the physical synthesis in that the logic is modified taking into consideration physical layout constraints and operational constraints. For example, all constraints, such as timing constraints, power consumption constraints, and the like, for not only the marked/colored logic elements and pathways, but other logic elements/pathways of the IC design, may be evaluated in combination with the emissions obfuscation requirements of the marked/colored logic elements to determine how to implement various optimizations in the IC design and physical layout of the IC design.

In some illustrative embodiments, for the marked logic elements and/or pathways, the emissions obfuscation optimizations applied may include special placement of marked logic elements in high density regions and/or special placement of marked/colored logic elements in close proximity to larger on-chip devices that generate larger obfuscating emissions. These emissions obfuscation optimizations may, in addition or alternatively, include special threshold voltage assignments of marked/colored logic elements to a relatively high threshold voltage that lowers the emissions of the marked/colored logic elements and other special path-based optimizations of the marked/colored logic elements or pathways.

To illustrate how these optimizations may be implemented, it is first important to recognize some concepts regarding logic placement during the IC design process. As is generally known in the art, a circuit, during placement operations of the IC design process, is represented as a set of rectangular blocks with given widths and heights which must fit into a bounding box. This set is denoted V. In addition to V itself, a number of subsets of V, e.g., E1, E2, . . . Em are given which are called nets. Blocks of each net must be connected by wires with a good placement minimizing the total wire length without creating regions over-populated by gates anywhere in the IC design, i.e., achieve a minimum wire length under maximum population density constraint for placement of gates of an IC design. Finding an exact minimum wire length, also referred to as the Steiner wire length, is computationally expensive even if the gates are fixed and thus, a half perimeter wire length approximation is usually used.

The maximum population density can be defined as the maximum area occupied by gates in a moving square window of a fixed size positioned anywhere within the bounding box of the IC design. That is, let f be the indicator function of the placement, where f is equal to 1 at points covered by blocks and 0 elsewhere. Then, the maximum population is the maximum value of the convolution off and the indicator function of the window. More generally, the maximum population can be defined as the maximum value of the convolution of f and any non-negative convolution kernel, such as Gaussian bell.

With these concepts in mind, a first emissions obfuscation optimization applied to the marked/colored logic elements and pathways may be to perform special placement of marked logic elements/pathways in high density regions. In order to perform such an optimization, a grid is superimposed on a placement solution and then in each tile (bin) the population density is calculated so as to select tiles (bins) where there is a sufficiently high population density for placement of marked logic elements, e.g., gates and flip-flops.

Figure 2B:
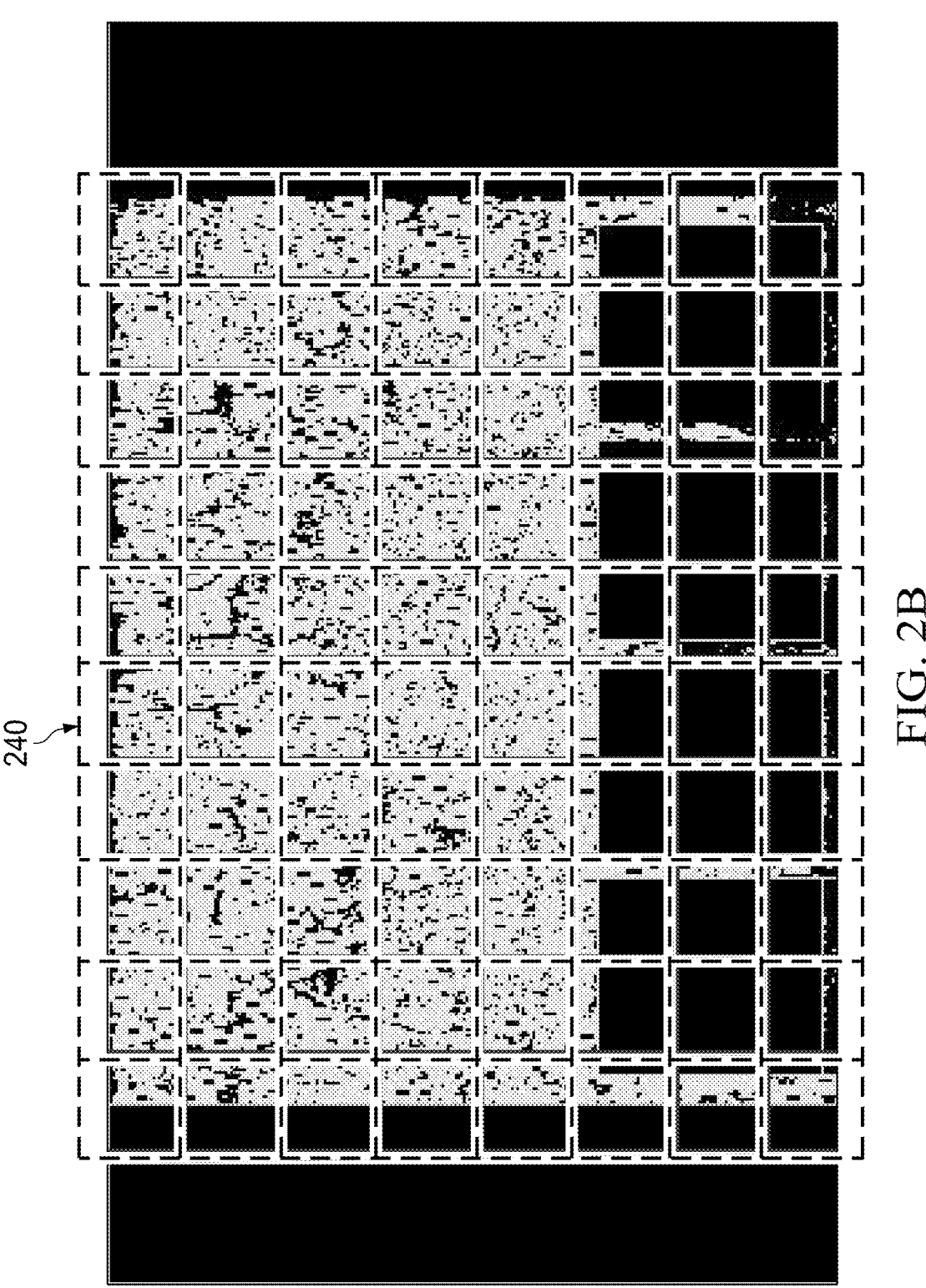
FIG. 2B is an example diagram showing an example emissions obfuscation optimization involving special placement of marked logic elements in high density regions in accordance with one illustrative embodiment.

FIG. 2B is an example diagram showing an example emissions obfuscation optimization involving special placement of marked logic elements in high density regions in accordance with one illustrative embodiment. As shown in FIG. 2B, the grid 240 is superimposed on the generated placement solution for the IC design prior to placement of the marked/colored logic elements and pathways that are to have their emissions obfuscated, e.g., the secret key path logic elements. Each square in the grid, i.e., each tile or bin, has an associated set of gates already part of the placement solution and thus, a population density for the tile or bin may be generated, such as by calculating the ratio of the gate area to the area of the tile/bin. Based on the calculated population densities for the various tiles, the highest density tiles may be selected as candidates for placement of the marked/colored logic elements and their pathways. This process may be iterative such that if a placement solution in the high density tiles/bins cannot be satisfactorily generated taking into account other design constraints, a next set of one or more highest density tiles/bins may be selected, and so forth, until a placement solution is achieved that maximizes the obfuscation within the other IC design constraints.

As mentioned above, another emissions obfuscation optimization that may be performed is to place marked/colored logic elements near relatively larger and higher emissions on-chip devices so that the emissions of the marked/colored logic elements are masked by the emissions of the relatively larger devices. It should be appreciated that the term "relatively larger", as it is used herein, refers either to the logic element being physically larger in terms of size or area, or relatively larger in terms of amount of emissions generated by the device. Typically, larger size/area devices will generate larger emissions, but there may be small devices that generate higher emissions and thus, relatively higher emission devices may be considered "relatively larger."

Figure 2C:
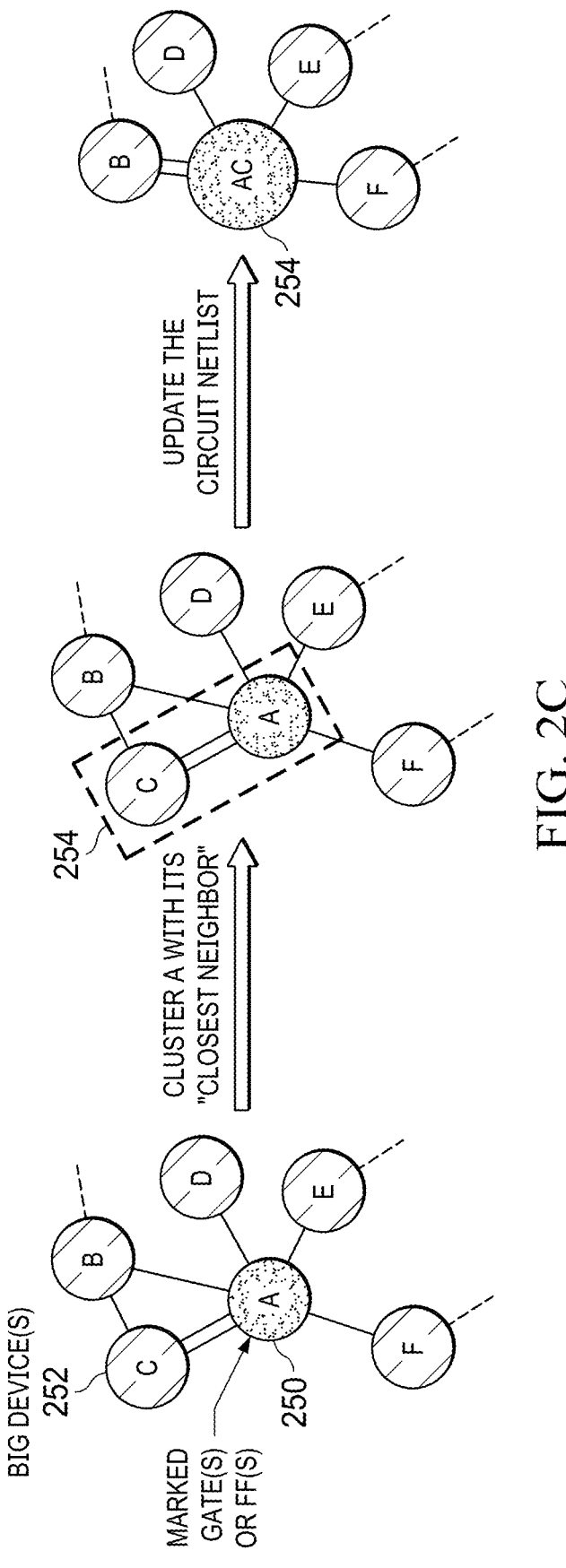
FIG. 2C is an example diagram showing an example emissions obfuscation optimization involving special placement of marked logic elements in close proximity to larger devices in accordance with one illustrative embodiment.

FIG. 2C is an example diagram showing an example emissions obfuscation optimization involving special placement of marked logic elements in close proximity to larger devices in accordance with one illustrative embodiment. Clustering is used during placement operations for timing improvement, but may be modified to perform clustering based on relative sizes of the logic elements so that marked/colored logic elements are clustered with other on-chip devices that have at least a predetermined size and which are closest to the marked/colored logic elements in the original IC design.

As shown in FIG. 2C, this optimization may be performed by using the clustering approach to placement of the marked/colored logic elements 250 with relatively larger devices 252. A clustered object is created by combining several gates into a single object that will be placed during placement optimization. In the depicted example, a clustered object may be generated by clustering marked gates or flip-flops 250 with relatively larger devices 252 such that they are guaranteed to be placed next to each other during placement optimization of the IC design. The clustering generates a combined clustered object 254 that combines the marked/colored logic elements 250 with their "closest neighbor" relatively larger on-chip device having a predetermined size or predetermined difference in size relative to the size of the marked/colored logic elements 250, e.g., at least 20% larger or the like. After emissions obfuscation based clustering is performed, the netlist for the IC design is updated to reflect the clustered object and its pathways.

Figure 2D:
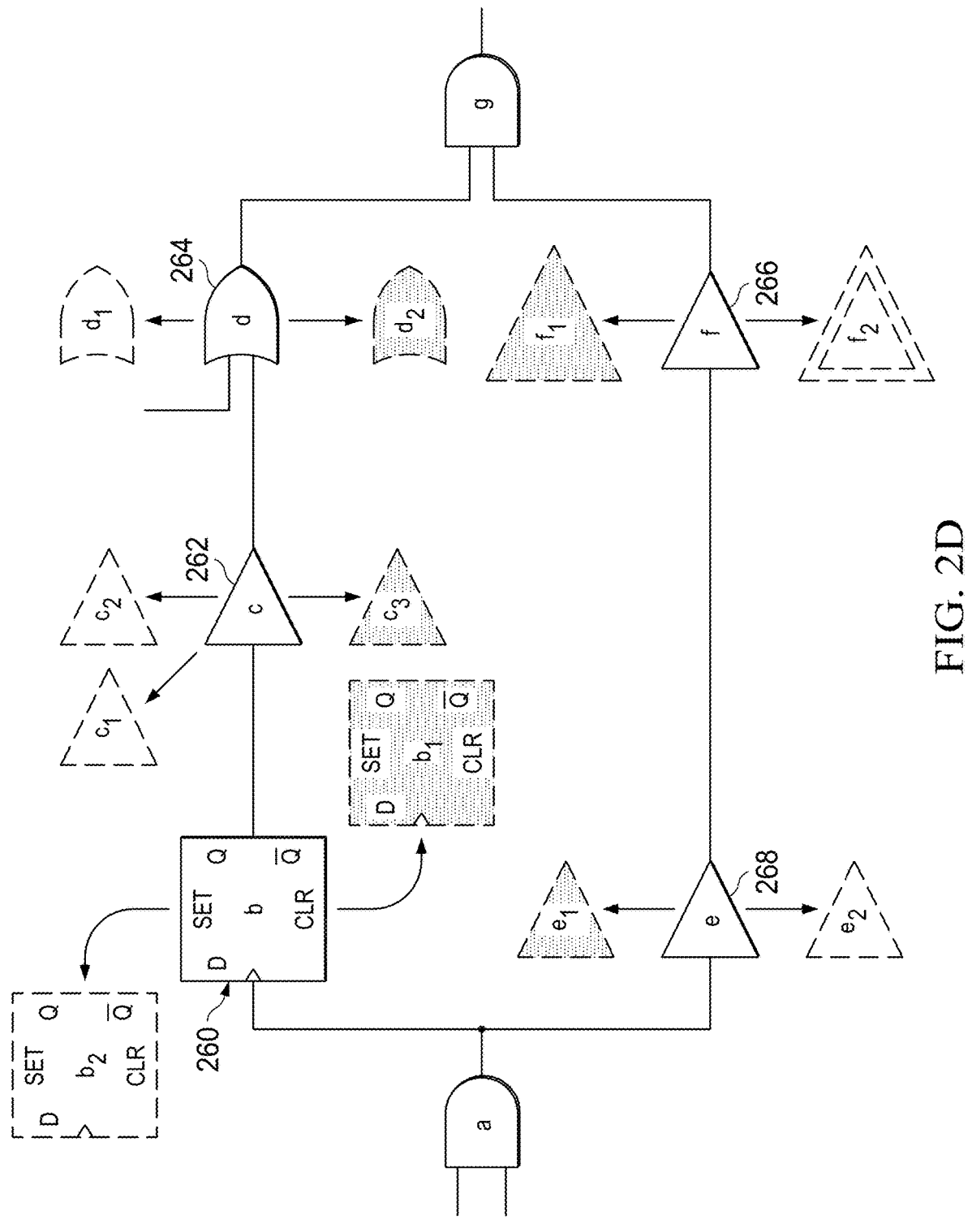
FIG. 2D is an example diagram showing an example emissions obfuscation optimization involving special assignment of threshold voltage Vt for marked logic elements in accordance with one illustrative embodiment.

Another emissions obfuscation optimization that may be employed is to select high threshold voltage Vt versions of marked/colored logic elements for inclusion in the IC design. FIG. 2D is an example diagram showing an example emissions obfuscation optimization involving special assignment of threshold voltage Vt for marked logic elements in accordance with one illustrative embodiment. With this optimization, it should be appreciated that each logic element marked/colored for emissions obfuscation optimization, e.g., gates or flip-flops, has multiple options for implementation with different threshold voltages Vt and that while the Vt assignment affects the power consumption of the gate or flip-flops, but the functionality stays the same. Moreover, as the Vt increases, the emissions decrease. Thus, by specifically selecting versions of the marked/colored logic elements that have relatively high Vt assignments, the emissions of these logic elements may be effectively reduced. Thus, for example, in FIG. 2D, it can be seen that there are multiple versions of each of the logic elements 260-268, i.e., alternative versions $b_1$-$b_2$, $c_1$-$c_3$, $d_1$-$d_2$, $e_1$-$e_2$, and $f_1$-$f_2$. For each marked/colored logic element 260-268, during emissions obfuscation optimization, a corresponding alternative implementation of the logic element 260-268 may be selected that has a highest threshold voltage Vt. For example, in the depicted example of FIG. 2D, alternative versions of logic elements 260-268 may be selected as high threshold voltage versions $b_1$, $c_3$, $d_2$, $e_1$, and $f_1$. Thus, intentional high Vt assignment optimizations may be used to obfuscate emissions of the marked/colored logic elements.

Figure 2E:
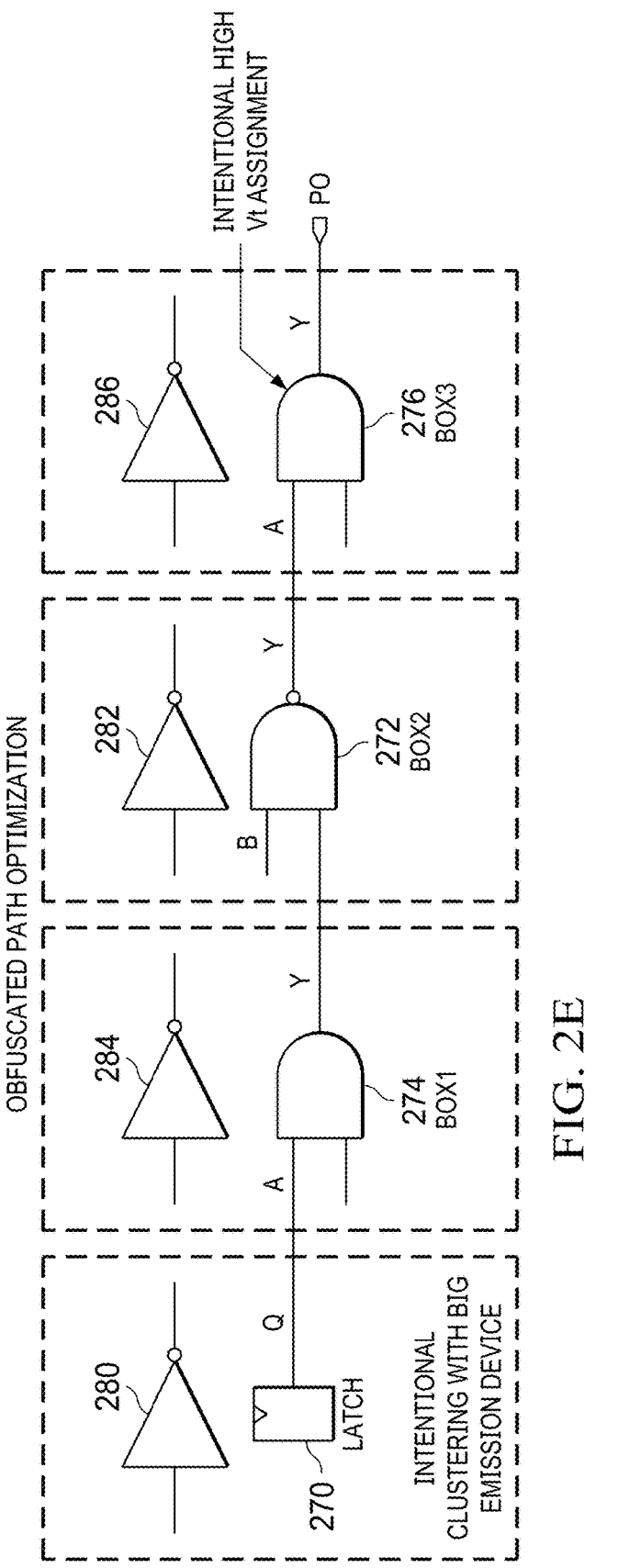
FIG. 2E is an example diagram showing an example emissions obfuscation optimization involving special path-based optimizations of obfuscated paths in accordance with one illustrative embodiment.

FIG. 2E is an example diagram showing an example emissions obfuscation optimization involving special path-based optimizations of obfuscated paths in accordance with one illustrative embodiment. That is, for an identified obfuscated path in the original RTL code, all or a subset of the plurality of the emissions obfuscation optimizations may be employed to obfuscate the path, e.g., the secret key path. For example, as shown in FIG. 2E, the depicted obfuscated path, is emissions obfuscation optimized by performing intentional clustering of marked/colored logic elements 270-276 with relatively larger on-chip devices 280-286 and by intentionally selecting versions of the marked/colored logic elements 270-276 that have relatively high Vt assignments from amongst the various alternatives for the marked/colored logic elements 270-276. Although not depicted in FIG. 2E, in addition, these optimizations may be performed with regard to the placement of the marked/colored logic elements 270-276 in a high population density tile of the IC design, such as shown in FIG. 2B.

With reference again to FIG. 2A, depending on the constraints and specifications of desired functionality, one or more of the emission obfuscation optimizations may be applied. As noted previously, the particular emission obfuscation optimizations applied may be dependent upon the desired level of security of the portions of the IC design that are to be obfuscated, performance considerations, power consumption considerations, and the like. For example, in a highly secure IC design, a plurality of emission obfuscation optimizations may be applied. Thus, for example, marked gates/flip-flops may be placed into high density regions where other logic elements in the high density region mask the emissions of the marked gates/flip-flops. Where such placement in high density regions is not possible, or it is more desirable based on the IC design, marked gates/flip-flops may be placed near larger devices whose emissions will mask the relatively lower emissions of the smaller marked gates/flip-flops. In addition, the threshold voltage assignments of marked gates/flip-flops may be set to high threshold voltage and other optimizations of the marked paths may be performed that obfuscate the emission of the marked paths.

The result is physical design 230 with emission obfuscation optimizations applied to the physical layout of the IC design. The physical design 230 may then be provided to downstream processing logic that is generally known in the art including physical verification engine 232 and layout post processing engine 234. As such physical verification and layout post processing is generally known in the art, further details are not provided herein. The resulting physical layout specification is provided to fabrication systems 236 for fabrication and the resulting IC chip devices are then provided to packaging and testing systems 238, as is generally known in the art.

The resulting IC devices will have the marked/colored IC device internal logic elements and pathways which have been modified to obscure their emissions from external probing and optical side-channel detection techniques. Thus, if one is to use any of these optical side-channel detection techniques on the IC device, they will not be able to discern the internal state of the emissions obfuscated portions of the IC device, e.g., the secret key storage and secret key pathway to the locked logic/functions of the IC device. As a result, unauthorized parties, e.g., attackers, cannot gain access to the secret key after storage of the secret key in the IC device, and hence, cannot unlock the correct functionality of the IC device.

As mentioned previously, in recent years with the use of secure key based function/logic locking circuits, the ability for unauthorized parties to gain access to the internal functioning states of an IC design has been diminished. However, with the advent of new optical based detection techniques, such security mechanisms against unauthorized access may be thwarted. The emissions obfuscation optimization mechanism of the illustrative embodiments provides an improved computing tool to modify the IC design to obfuscate the emissions of such sensitive portions of an IC design whose internal state is to be maintained secret from external probing and observation. Thus, the emissions obfuscation optimization mechanism of the illustrative embodiments, in at least one illustrative embodiment, may be applied to the secret key storage and pathway to locking circuitry on an IC device so as to secure the secret key from external access through emissions based side-channel detection.

Figure 3A:
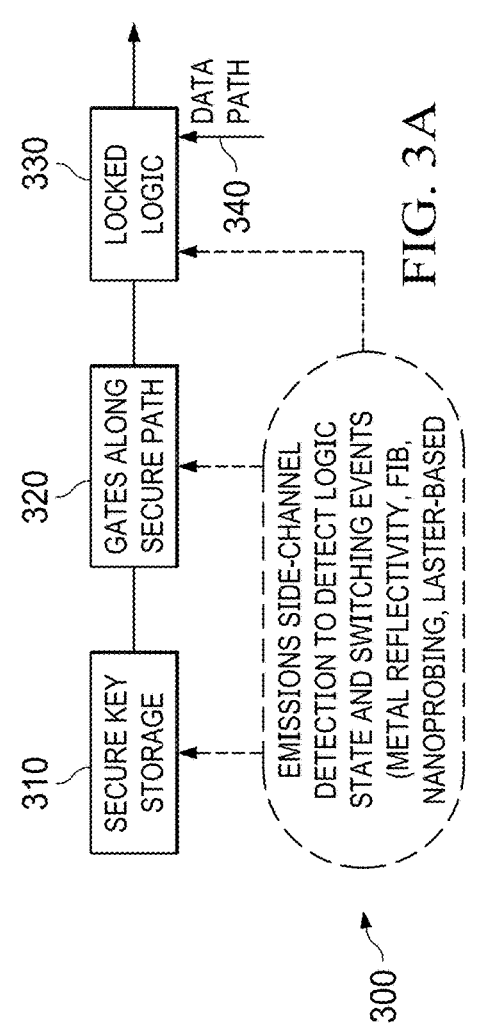
FIG. 3A is an example block diagram illustrating a secure key pathway and attack points/threats along the secure key pathway.

FIG. 3A is an example block diagram illustrating a secure key pathway and attack points/threats along the secure key pathway. As shown in FIG. 3, the secure key pathway 300 comprises a secure key storage 310, gates 320 along the path from the secure key storage 310 to the locked logic 330, and a data path 340 as input to the locked logic 330. As noted above, the locked logic 330 is locked by locking logic that only unlocks correct functionality of the locked logic 330 when a secure key is programmed into the secure key storage 310 and provided along the secure key path 300 via gates 320 to the locked logic 330. There are many points along this secure key path 300 where emission based side channel detection may be employed to gain access to the secure key. Once the secure key is known, the secret key may be used to access other IC devices and unlock the locked circuitry of these other IC devices.

The secure key storage 310 may comprise various logic elements such as an on-chip non-volatile memory, physical unclonable function (PUF), scan-chain, latch, flip-flop, etc. The secure key may be captured through emissions based side channel detection executed on the logic elements of the secure key storage 310, such as using focused ion beam, nanoprobing, determining metal reflectivity, laser-based detection, or the like, to detect the logic state and switching events. The same is true of the gates 320 along the secure path 300, as well as the locked logic 330 where the secure key must be input to unlock the correct functionality of the locked logic 330 on the data flowing along data path 340.

Figure 3B:
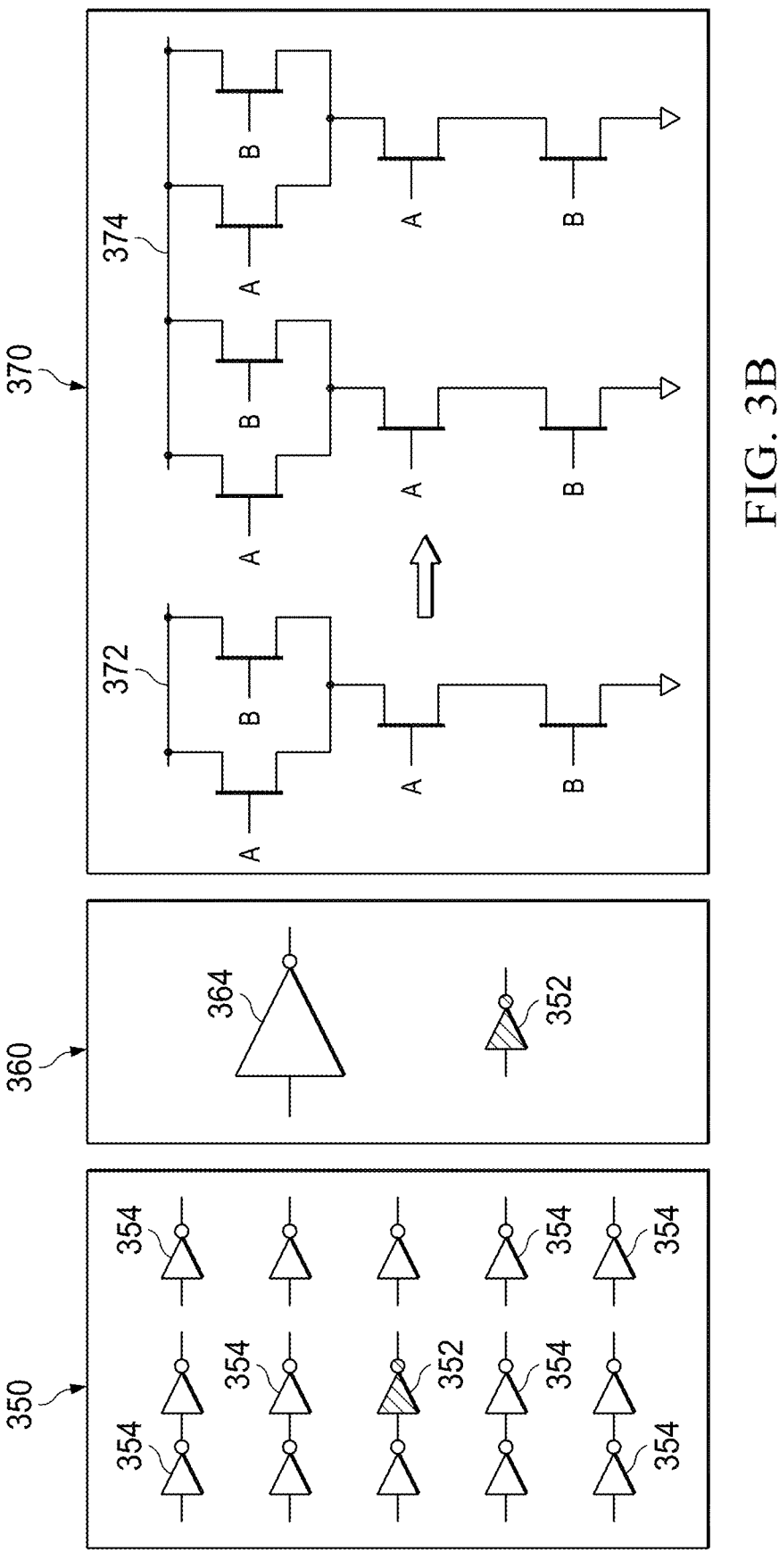
FIG. 3B is an example diagram showing example techniques for obfuscating optical characteristics of secure key pathway integrated circuit elements in accordance with one illustrative embodiment.

FIG. 3B is an example diagram showing example techniques for obfuscating emissions of secure key pathway integrated circuit elements in accordance with one illustrative embodiment. These examples are similar to the examples previously described above with regard to FIGS. 2B-2D. The example techniques are examples of layout aware protections of gates, macros, latches, etc. provided in the secure key storage, along the secure key pathway, and/or at the locked logic. It should be appreciated that one or more of these protections may be implemented as part of emission obfuscation optimizations, performed by the emission obfuscation optimization engine 222 of one or more illustrative embodiments, on the marked/colored IC design logic elements in an IC design, such as during logic and/or physical synthesis.

As shown in FIG. 3B, a first technique 350 may be to control the placement of an integrated circuit element 352 of the secure key pathway to be in an area of the IC design that has a high density layout of IC logic elements 354, or to introduce a high density area of IC logic elements 354 into the IC design to make localization of the IC logic element 352 of interest more difficult. A second technique 360 may be to mask a relatively smaller IC logic element 362 with a relatively larger IC logic element 364 which will have a brighter emission by controlling placement of the IC logic elements 362 and 364 such that the IC logic element 362 of interest is in sufficiently close proximity, as governed by physical design rules for a given technology, to the IC logic element 364 that its emissions will be masked by the emissions of IC logic element 364.

A third technique 370 may be to modify the IC logic element of interest 372 to make it appear to be a different type of IC logic element 374 or to modify the IC logic element 372 to avoid and/or reduce state dependent emission signature changes (intensity and/or shape). That is, the NAND design 372 in FIG. 3B has a corresponding emission signature. By modifying the NAND gate 372 to have the design/layout of element 374, which is still a NAND gate, its corresponding emission signature is different than that of NAND gate 372. In this way, the emission pattern/signature of the NAND gate 372 is obfuscated.

It should also be appreciated that the marked/colored logic elements, e.g., 352 and 372 in FIG. 3B, can be selected to be versions of these logic elements that have relatively high Vt from the available alternatives. By selecting the relatively high Vt versions of these logic elements, their corresponding emission intensity is much lower, and is less susceptible to optical or emissions based side-channel detection techniques. This high Vt assignment emissions obfuscation optimization may be used along with one or more of the emissions obfuscation optimizations 350-370 in FIG. 3B, or may be used in areas that do not have high population density or large relatively large emission on-chip devices, but may still provide some measure of emission obfuscation.

Figure 4B:
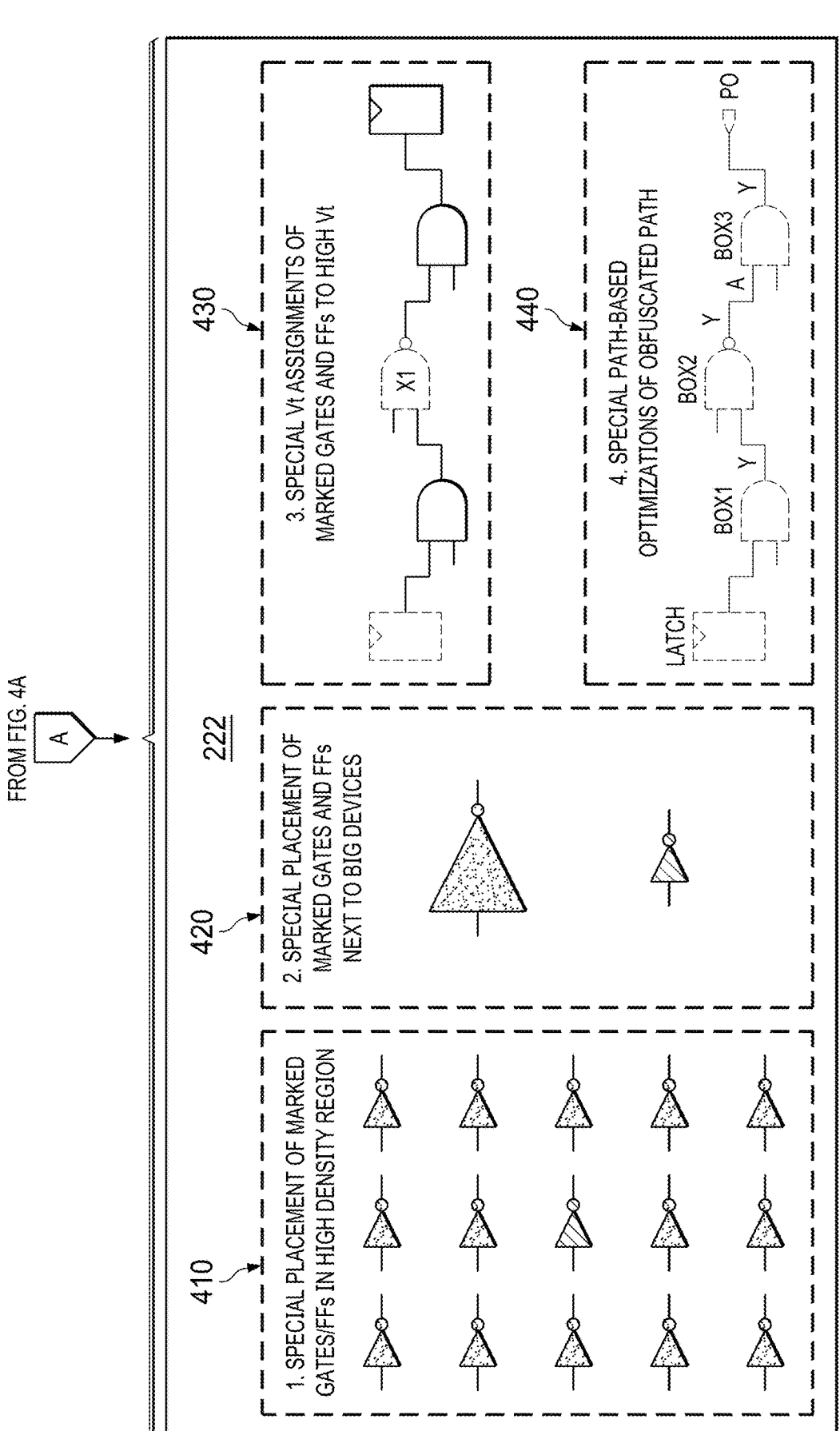

FIGS. 4A and 4B show a conceptual diagram of a design flow of an integrated circuit design through the obfuscation optimization logic of an emission obfuscation optimization engine according to one illustrative embodiment. The process shown in the conceptual diagram of FIGS. 4A and 4B may be implemented by the emission obfuscation optimization engine 222 of FIG. 2A, for example, when performing optimization of the logic and physical layout of the IC design so as to minimize the likelihood that emissions from secure IC design logic elements and/or pathways, such as the secret key storage, pathway, and locked logic, may be detected through emissions based side-channel detection techniques.

As shown in FIGS. 4A and 4B, the operation depicted in the conceptual diagram assumes that an obfuscated RTL 214 is generated for an IC design, such as via engines 210 and 212 in FIG. 2A, for example. The obfuscated RTL 214 comprises portions of the HDL code 402 that include obfuscation indicators that indicate that these portions of the HDL code 402 are describing IC design logic elements that are part of a secure portion of the IC design whose emissions are to be obfuscated. In the depicted example, HDL code text such as "working_key" and "locking_key" represent obfuscation indicators. The emission obfuscation optimization engine 222 may parse the HDL code to detect these predefined obfuscation indicators and identify the corresponding portions 402 of the HDL code 214 corresponding to those instances of obfuscation indicators with regard to the corresponding logic elements in the IC design. Thus, for example, having identified the obfuscation indicators in portion 402 of the obfuscated RTL 214, the corresponding IC design logic elements along a secure key pathway 404 may be identified during the logic synthesis 216. These IC design logic elements of the secure key pathway 404 may be marked/colored during the logic synthesis 216 for optimization using emissions obfuscation optimizations.

The identified IC design logic elements marked/colored in this manner may then have their configurations and placements modified by application of emissions obfuscation optimizations 410-440 as part of the logic synthesis 216 and/or physical synthesis 218. Such emissions obfuscation optimizations may be implemented by the emission obfuscation optimization engine 222 and may include placement of marked/colored logic elements in high density regions 410 (see FIG. 2B), placement of marked/colored logic elements next to relatively larger (higher emission) on-chip devices 420 (see FIG. 2C), assignment of threshold voltages of marked/colored logic elements to a relatively high threshold voltage 430 which reduces the emissions of those marked/colored logic elements (see FIG. 2D), and path-based optimizations of the obfuscated path 440 (see FIG. 2E). It should be appreciated that these optimizations for obfuscating emissions of the marked/colored logic elements are performed based on design constraints, such as area, timing, power, etc., and may be performed along with other optimizations to optimize the design with regard to these constraints, often leading to a tradeoff in the IC design between competing interests. The design optimization engine 220 provides the computer logic for making such tradeoff evaluations in an automated manner given the design constraints.

Figure 5:
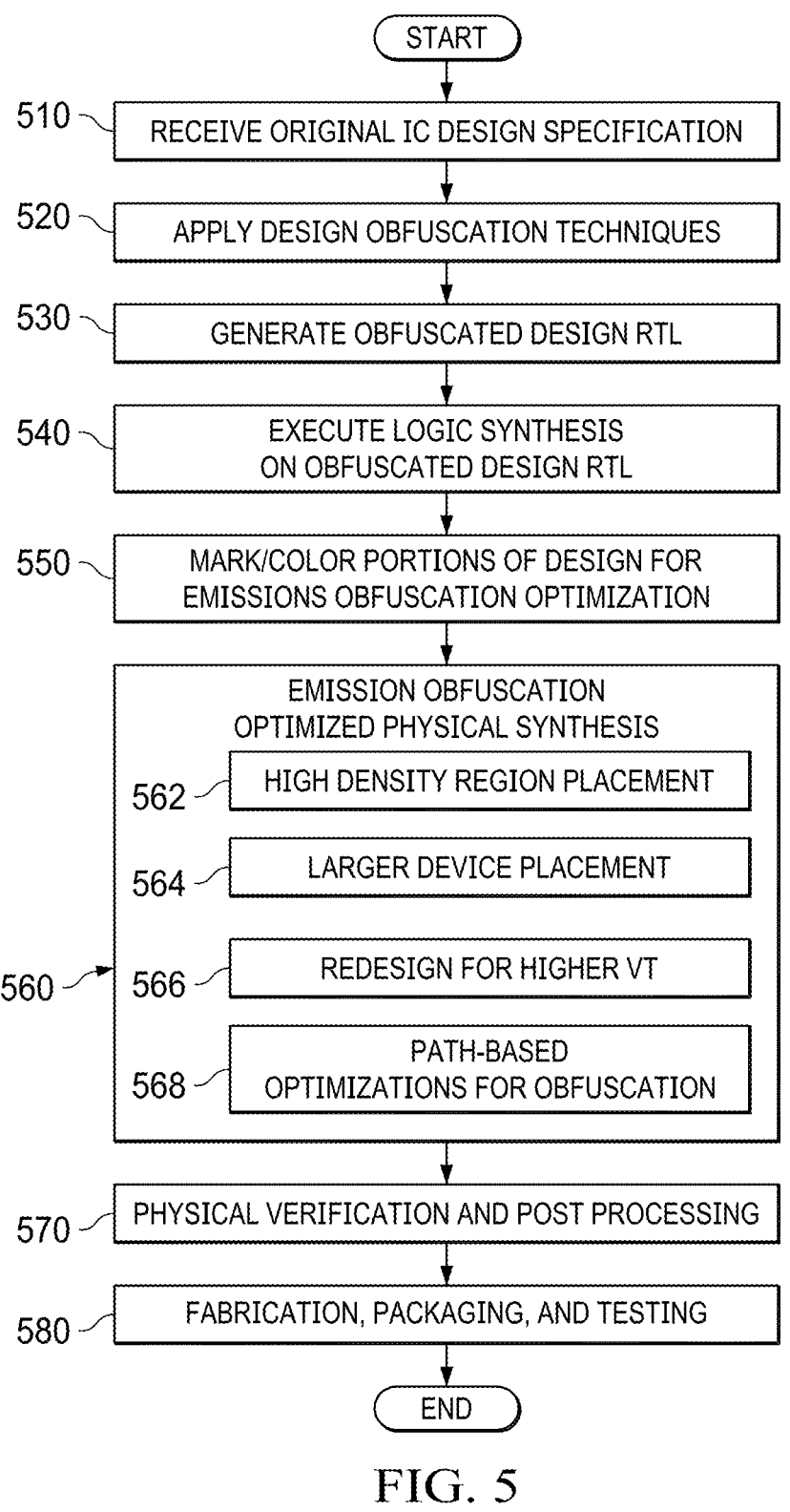
FIG. 5 is an example flowchart outlining an example operation of an integrated circuit (IC) design process employing an optical obfuscation optimization engine in accordance with one illustrative embodiment.

FIG. 5 is an example flowchart outlining an example operation of an integrated circuit (IC) design process employing an emission obfuscation optimization engine in accordance with one illustrative embodiment. The operation outlined in FIG. 5 may be implemented by an emission obfuscation optimization IC design computer tool in accordance with one illustrative embodiment, such as emission obfuscation optimization IC design and fabrication system 200 in FIG. 2A. In the depicted flowchart, steps 510-530 may be implemented, for example, by the system specification and architecture design engine 210 and functional/logic design engine 212 to generate the obfuscated design RTL. The subsequent steps 540-568 may be implemented by IC design computer tools for performing logic and physical synthesis on the obfuscated design RTL, where such logic and physical synthesis computer tools operate in conjunction with an emission obfuscation optimization engine in accordance with one illustrative embodiment, such as emission obfuscation optimization engine 222 in FIG. 2A. Steps 570-580 may be performed by downstream logic of the IC design and fabrication tools, e.g., downstream elements 232 and 234 of IC design computer tools 202 and fabrication, packaging, and testing tools 204, may then operate on the modified physical design of the IC device having the emissions obfuscation optimized layout.

As shown in FIG. 5, the operation starts by receiving the original IC design specification (step 510). Identification of the portions of the IC design specification where emissions obfuscation techniques are to be applied to the original IC design is then performed (step 520) to generate the obfuscated design RTL having the obfuscation indicators and design constraints (step 530). Logic synthesis is then executed on the obfuscated design RTL (step 540) which involves performing parsing of the obfuscated design RTL to identify obfuscation indicators. Based on the identification of instances of obfuscation indicators in the obfuscated design RTL, the security sensitive portions of the obfuscated design RTL are identified and marked/colored (step 550). For example, this process may be used to identify portions of the obfuscated design RTL that correspond to a secure key storage, path, and locked logic.

Thereafter, having marked/colored the logic elements and pathways corresponding to the identified portions of the obfuscated design RTL in which instances of obfuscation indicators are present, an emission obfuscation optimized physical synthesis operation is performed on the marked/colored logic elements and pathways (step 560). The emission obfuscation optimized physical synthesis operation involves one or more of the optimizations in operations 562-568 which operate to obfuscate the emissions generated by the marked/colored logic elements such that emission based side channel detection is made ineffective. For example, the operation 562 corresponds to an optimization to place marked/colored logic elements in high density regions of the IC design physical layout. Operation 564 corresponds to the optimization to place marked/colored logic elements next to relatively larger, and higher emitting, logic elements in the IC design physical layout. Operation

566 corresponds to assigning relatively higher threshold voltages (Vt) to logic elements that are marked/colored for emission obfuscation. Operation 568 corresponds to other path-based optimizations of the marked/colored logic elements/pathway. All or a subset of these optimizations may be applied without departing from the spirit and scope of the present invention.

After having optimized the physical layout of the IC design to obfuscate emissions of the marked/colored logic elements and pathways, subsequent downstream processing and fabrication is performed. For example, physical verification and post processing of the layout are performed (step 570). Thereafter, the IC device corresponding to the physical layout is fabricated and packaging and testing are performed (step 580). The operation then terminates.

Thus, the illustrative embodiments provide improved computer tools for optimizing the design of an integrated circuit device so as to obfuscate the emissions of portions of the integrated circuit design that are to be kept secure from emissions based side-channel detection techniques. The illustrative embodiments provide mechanisms to modify the integrated circuit design to obfuscate such emissions which results in an integrated circuit device that is more secure and able to be fabricated using the integrated circuit device supply chain without exposing sensitive internal workings of the integrated circuit device to unauthorized access. Thus, the mechanisms of the illustrative embodiments may be implemented in a design flow for performing semiconductor design, manufacturing and testing in which the design flow is improved to generate devices that are less susceptible to emission based side channel detection of internal states of the devices.

Figure 6:
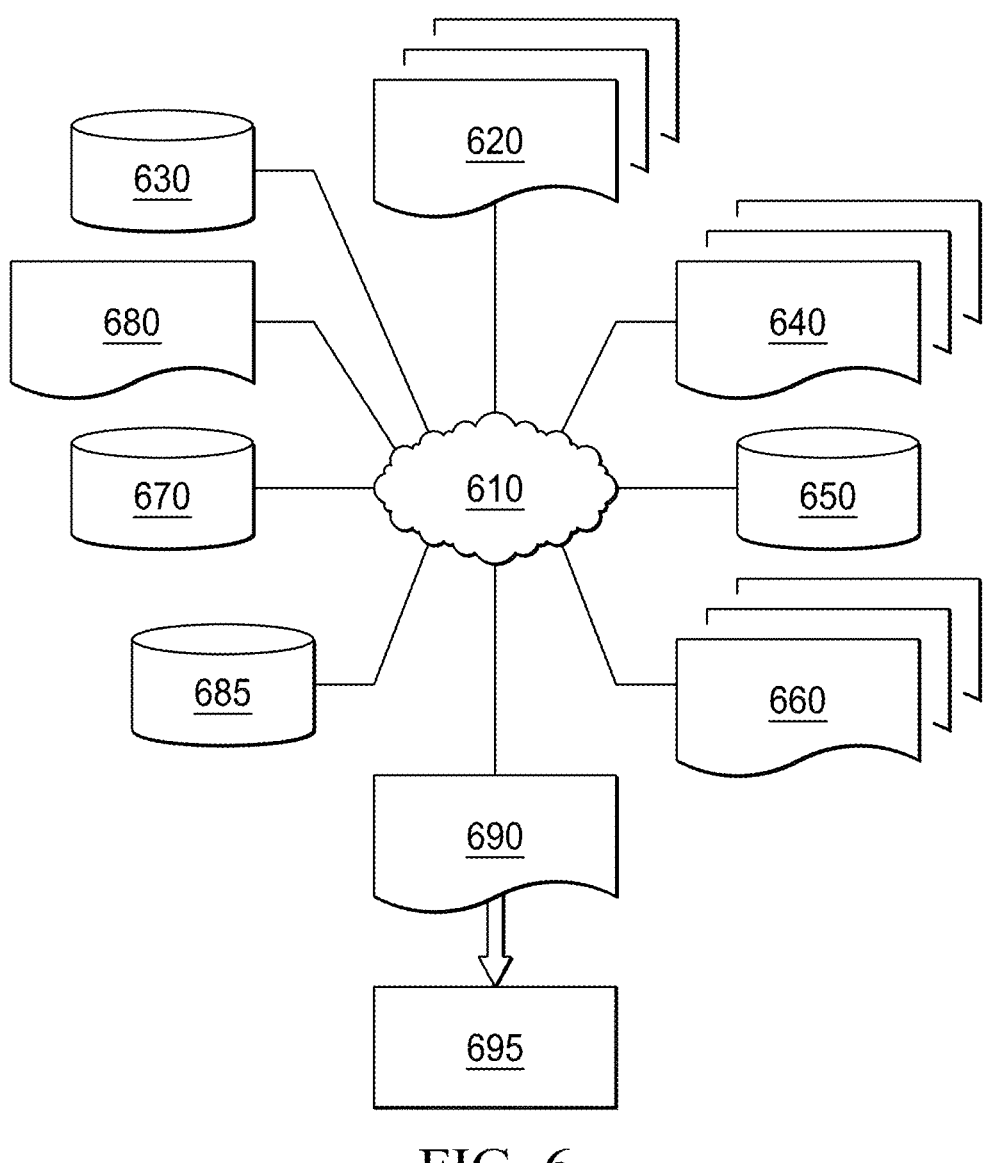
FIG. 6 is a flow diagram of a design process used in semiconductor design, manufacture, and/or test.

FIG. 6 shows a block diagram of an exemplary design flow 600 used for example, in semiconductor design, manufacturing, and/or test. Design flow 600 may vary depending on the type of IC device being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises a data structure specifying portions of the design where obfuscation of the internal state is to be performed, e.g., comprises obfuscation indicators, and may be provided in the form of schematics, a hardware-description language (HDL), e.g., Verilog, VHDL, etc., or the like. Design structure 620 may be contained on one or more machine readable media. For example, design structure 620 may be a text data file or a graphical data for representation of an integrated circuit design optimized in accordance with one or more of the illustrative embodiments. Design process 610 preferably synthesizes (or translates) an embodiment of an IC device, optimized for emission obfuscation in accordance with one or more illustrative embodiments of the invention as discussed previously, into a netlist 680, where netlist 680 is, for example, a list of wires, transistors, logic gates, control circuits, I/O, models, etc. that describes the connections to other elements and circuits in an integrated circuit design, which is then recorded on at least one machine readable medium. This may be an iterative process in which netlist 680 is resynthesized one or more times depending on design specifications and parameters for the circuit.

Design process 610 may include using a variety of inputs such as, for example, inputs from library elements 630 which may house a set of commonly used elements, circuits, and devices, including models, layouts, and symbolic representations, for a given manufacturing technology (e.g., different technology nodes, 7 nm, 14, nm, 32 nm, etc.), design specifications 640, characterization data 650, verification data 660, design rules 670, and test data files 685 (which may include test patterns and other testing information). Design process 610 may further include, for example, circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. Moreover, as described previously, one of ordinary skill can appreciate the modifications to such design automation tools provided by illustrative embodiments of the present invention to facilitate emission obfuscation optimizations of the integrated circuit design during logic and physical synthesis such that the resulting integrated circuit design and fabricated devices are protected against emission based side channel detection techniques accessing internal state information for security sensitive portions of the integrated circuit design.

It should be appreciated that the design structure 620 in accordance with the illustrative embodiments, while depicted in FIG. 6 as being part of the depicted design flow, is not limited to the design flow shown in FIG. 6. To the contrary, the design structure of the illustrative embodiments is not limited to any specific design flow and many modifications may be made to the depicted design flow without departing from the spirit and scope of the present invention.

Design process 610 preferably translates an integrated circuit design optimized for emission obfuscation in at least selected portions of the integrated circuit design in accordance with one or more emission obfuscation optimization techniques as described above, along with any additional integrated circuit design or data (if applicable), into a second design structure 690. Design structure 690 resides on a storage medium in a data format used for the exchange of layout data of integrated circuits (e.g. information stored in a GDSII (GDS2), GL1, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an integrated circuit device optimized for emission obfuscation in accordance with one or more illustrative embodiments of the invention. Design structure 690 may then proceed to a stage 695 where, for example, design structure 690 proceeds to tape-out, is released to manufacturing, is released to a mask house, is sent to another design house, is sent back to the customer, or the like.

As described above, it is clear that the mechanisms of the illustrative embodiments are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

As noted above, the mechanisms of the illustrative embodiments improve the computer tools that are required to generate integrated circuit designs and physical layouts of integrate circuit devices. Specifically, the illustrative embodiments improve these computer tools to provide additional optimization mechanisms to optimize the integrated circuit design and corresponding integrated circuit devices to provide additional protections against emission based side-channel detection techniques for gaining unauthorized access to internal states of secure portions of the integrated circuit design/device. The computing devices and systems that provide the improved computer tools may be part of a variety of different types of data processing environments including distributed data processing environments and stand alone computing devices. In one or more illustrative embodiments, the improved computer tools are part of a distributed data processing environment in which users may interface with integrated circuit design computing tools, such as those shown in FIG. 2A above, via one or more client computing devices which interface with one or more server computing devices that may be locally or remotely located and accessible via one or more data networks through wired and/or wireless data communication links. For example, a designer may use their client computing device to access integrated circuit design computer tools provided remotely at one or more server computing systems, to design an integrated circuit device and have the resulting integrated circuit device optimized via the mechanisms of the illustrative embodiments to thereby generate an emission obfuscation optimized integrated circuit design which is then provided to yet other server computing devices of fabrication tools providers to then fabricate the resulting integrated circuit device itself.

Figure 7:
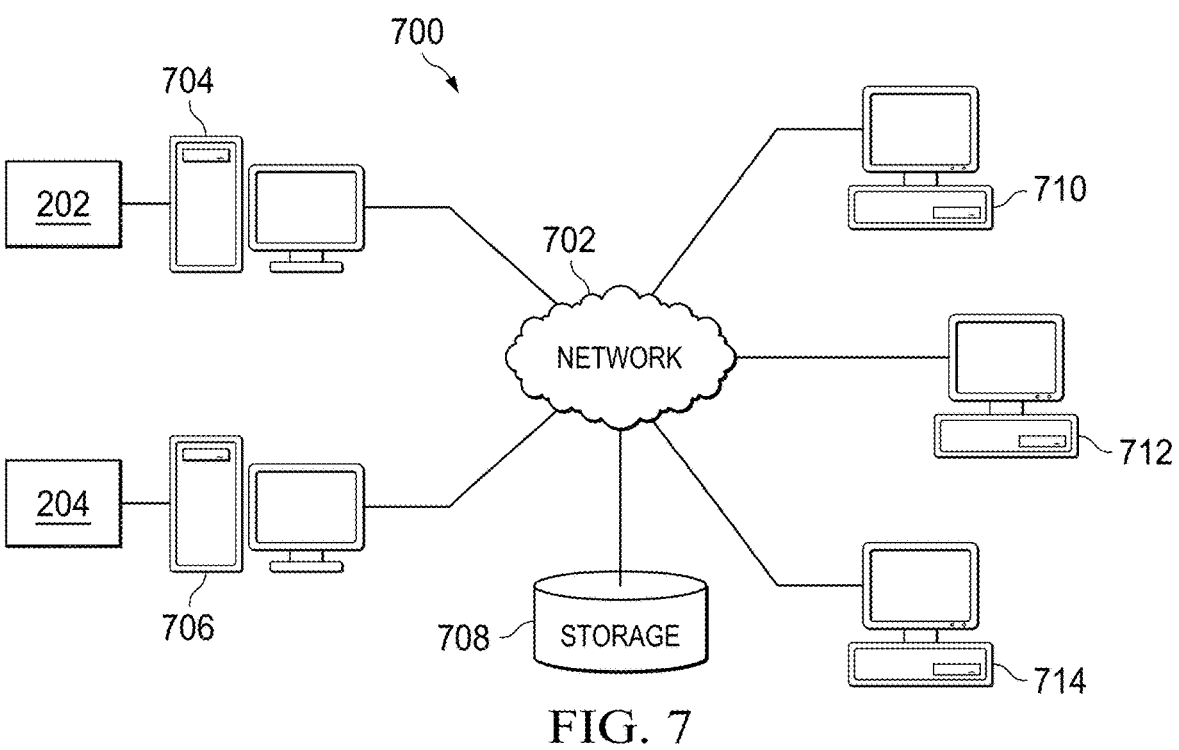
FIG. 7 is an example diagram of a distributed data processing system in which aspects of the illustrative embodiments may be implemented.
Figure 8:
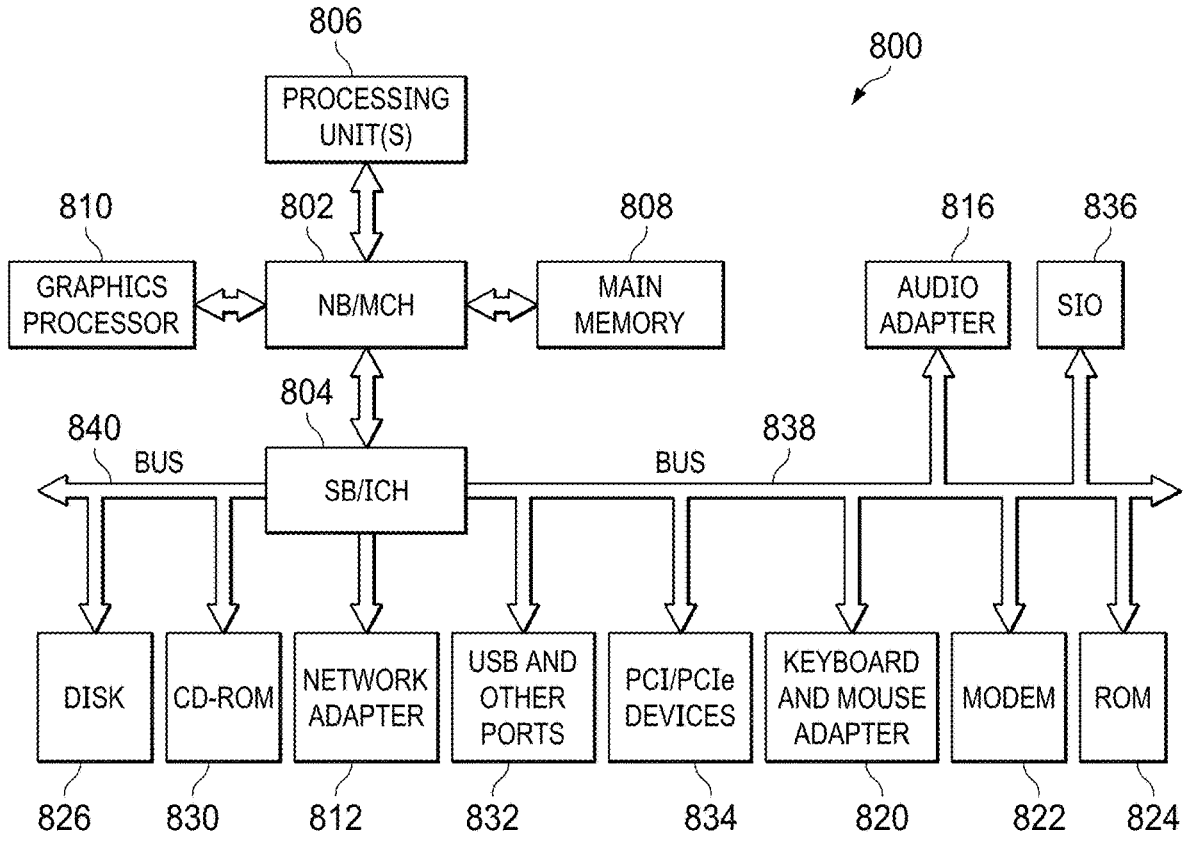
FIG. 8 is an example block diagram of a computing device in which aspects of the illustrative embodiments may be implemented.

In order to provide a context for the description of the specific elements and functionality of the illustrative embodiments previously described, FIGS. 7 and 8 are provided hereafter as example environments in which aspects of the illustrative embodiments may be implemented. It should be appreciated that FIGS. 7 and 8 are only examples and are not intended to assert or imply any limitation with regard to the environments in which aspects or embodiments of the present invention may be implemented. Many modifications to the depicted environments may be made without departing from the spirit and scope of the present invention.

FIG. 7 depicts a pictorial representation of an example distributed data processing system in which aspects of the illustrative embodiments may be implemented. Distributed data processing system 700 may include a network of computers in which aspects of the illustrative embodiments may be implemented. The distributed data processing system 700 contains at least one network 702, which is the medium used to provide communication links between various devices and computers connected together within distributed data processing system 700. The network 702 may include connections, such as wire, wireless communication links, or fiber optic cables.

In the depicted example, server 704 and server 706 are connected to network 702 along with storage unit 708. In addition, clients 710, 712, and 714 are also connected to network 702. These clients 710, 712, and 714 may be, for example, personal computers, network computers, or the like. In the depicted example, server 704 provides data, such as boot files, operating system images, and applications to the clients 710, 712, and 714. Clients 710, 712, and 714 are clients to server 704 in the depicted example. Distributed data processing system 700 may include additional servers, clients, and other devices not shown.

In the depicted example, distributed data processing system 700 is the Internet with network 702 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 700 may also be implemented to include a number of different types of networks, such as for example, an intranet, a local area network (LAN), a wide area network (WAN), or the like. As stated above, FIG. 7 is intended as an example, not as an architectural limitation for different embodiments of the present invention, and therefore, the particular elements shown in FIG. 7 should not be considered limiting with regard to the environments in which the illustrative embodiments of the present invention may be implemented.

As shown in FIG. 7, one or more of the computing devices, e.g., server 704, may be specifically configured to implement one or more computing tools of an emission obfuscation optimization IC design and fabrication system, e.g., the IC design generation and optimization computing tools, e.g., 202 in FIG. 2A, while others of the computing devices, e.g., server 706, may implement other computing tools of the an emission obfuscation optimization IC design and fabrication system, e.g., the computing and fabrication tools, e.g., 204 in FIG. 2A, used to fabricate the IC devices themselves in accordance with the emissions obfuscation optimized IC design. The configuring of the computing device may comprise the providing of application specific hardware, firmware, or the like to facilitate the performance of the operations and generation of the outputs described herein with regard to the illustrative embodiments. The configuring of the computing device may also, or alternatively, comprise the providing of software applications stored in one or more storage devices and loaded into memory of a computing device, such as server 704, for causing one or more hardware processors of the computing device to execute the software applications that configure the processors to perform the operations and generate the outputs described herein with regard to the illustrative embodiments. Moreover, any combination of application specific hardware, firmware, software applications executed on hardware, or the like, may be used without departing from the spirit and scope of the illustrative embodiments.

It should be appreciated that once the computing device is configured in one of these ways, the computing device becomes a specialized computing device specifically configured to implement the mechanisms of the illustrative embodiments and is not a general purpose computing device. Moreover, as described herein, the implementation of the mechanisms of the illustrative embodiments improves the functionality of the computing device and provides a useful and concrete result that facilitates optimization of IC designs with regard to obfuscating emissions of internal logic of portions of the IC design from detection by emission side-channel detection techniques. The illustrative embodiments provide tools that are able to identify specific instances of obfuscation indicators in hardware descriptions of integrated circuit designs and determine the corresponding IC logic elements for the portions of the IC design corresponding to these instances of obfuscation indicators. The particular optimizations that may be employed for the identified IC logic elements may include modifying physical placement of IC logic elements in high density regions, controlling placement of IC logic elements to be in close proximity to larger devices that will mask the IC logic elements' emissions, modifying the threshold voltage of the logic elements so as to reduce emissions, and performing other path-based optimizations of obfuscated paths. The emissions obfuscated optimized IC design may then be used to fabricate IC devices that are strengthened against emission based side-channel detection techniques.

As noted above, the mechanisms of the illustrative embodiments utilize specifically configured computing devices, or data processing systems, to perform the operations of an emission obfuscation optimization IC design and fabrication system. These computing devices, or data processing systems, may comprise various hardware elements which are specifically configured, either through hardware configuration, software configuration, or a combination of hardware and software configuration, to implement one or more of the systems/subsystems described herein. FIG. 8 is a block diagram of just one example data processing system in which aspects of the illustrative embodiments may be implemented. Data processing system 800 is an example of a computer, such as server 704 in FIG. 7, in which computer usable code or instructions implementing the processes and aspects of the illustrative embodiments of the present invention may be located and/or executed so as to achieve the operation, output, and external effects of the illustrative embodiments as described herein.

In the depicted example, data processing system 800 employs a hub architecture including north bridge and memory controller hub (NB/MCH) 802 and south bridge and input/output (I/O) controller hub (SB/ICH) 804. Processing unit 806, main memory 808, and graphics processor 810 are connected to NB/MCH 802. Graphics processor 810 may be connected to NB/MCH 802 through an accelerated graphics port (AGP).

In the depicted example, local area network (LAN) adapter 812 connects to SB/ICH 804. Audio adapter 816, keyboard and mouse adapter 820, modem 822, read only memory (ROM) 824, hard disk drive (HDD) 826, CD-ROM drive 830, universal serial bus (USB) ports and other communication ports 832, and PCI/PCIe devices 834 connect to SB/ICH 804 through bus 838 and bus 840. PCI/PCIe devices may include, for example, Ethernet adapters, add-in cards, and PC cards for notebook computers. PCI uses a card bus controller, while PCIe does not. ROM 824 may be, for example, a flash basic input/output system (BIOS).

HDD 826 and CD-ROM drive 830 connect to SB/ICH 804 through bus 840. HDD 826 and CD-ROM drive 830 may use, for example, an integrated drive electronics (IDE) or serial advanced technology attachment (SATA) interface. Super I/O (SIO) device 836 may be connected to SB/ICH 804.

An operating system runs on processing unit 806. The operating system coordinates and provides control of various components within the data processing system 800 in FIG. 8. As a client, the operating system may be a commercially available operating system such as Microsoft® Windows 70®. An object-oriented programming system, such as the Java™ programming system, may run in conjunction with the operating system and provides calls to the operating system from Java™ programs or applications executing on data processing system 800.

As a server, data processing system 800 may be, for example, an IBM eServer™ System p® computer system, Power™ processor based computer system, or the like, running the Advanced Interactive Executive (AIX®) operating system or the LINUX® operating system. Data processing system 800 may be a symmetric multiprocessor (SMP) system including a plurality of processors in processing unit 806. Alternatively, a single processor system may be employed.

Instructions for the operating system, the object-oriented programming system, and applications or programs are located on storage devices, such as HDD 826, and may be loaded into main memory 808 for execution by processing unit 806. The processes for illustrative embodiments of the present invention may be performed by processing unit 806 using computer usable program code, which may be located in a memory such as, for example, main memory 808, ROM 824, or in one or more peripheral devices 826 and 830, for example.

A bus system, such as bus 838 or bus 840 as shown in FIG. 8, may be comprised of one or more buses. Of course, the bus system may be implemented using any type of communication fabric or architecture that provides for a transfer of data between different components or devices attached to the fabric or architecture. A communication unit, such as modem 822 or network adapter 812 of FIG. 8, may include one or more devices used to transmit and receive data. A memory may be, for example, main memory 808, ROM 824, or a cache such as found in NB/MCH 802 in FIG. 8.

As mentioned above, in some illustrative embodiments the mechanisms of the illustrative embodiments may be implemented as application specific hardware, firmware, or the like, application software stored in a storage device, such as HDD 826 and loaded into memory, such as main memory 808, for executed by one or more hardware processors, such as processing unit 806, or the like. As such, the computing device shown in FIG. 8 becomes specifically configured to implement the mechanisms of the illustrative embodiments and specifically configured to perform the operations and generate the outputs described above with regard to the an emission obfuscation optimization IC design and fabrication system.

Those of ordinary skill in the art will appreciate that the hardware in FIGS. 7 and 8 may vary depending on the implementation. Other internal hardware or peripheral devices, such as flash memory, equivalent non-volatile memory, or optical disk drives and the like, may be used in addition to or in place of the hardware depicted in FIGS. 7 and 8. Also, the processes of the illustrative embodiments may be applied to a multiprocessor data processing system, other than the SMP system mentioned previously, without departing from the spirit and scope of the present invention.

Moreover, the data processing system 800 may take the form of any of a number of different data processing systems including client computing devices, server computing devices, a tablet computer, laptop computer, telephone or other communication device, a personal digital assistant (PDA), or the like. In some illustrative examples, data processing system 800 may be a portable computing device that is configured with flash memory to provide non-volatile memory for storing operating system files and/or user-generated data, for example. Essentially, data processing system 800 may be any known or later developed data processing system without architectural limitation.

It should be appreciated that the illustrative embodiments may take the form of an entirely hardware embodiment, an software embodiment in which the software is specifically loaded into a memory and executed by hardware processors of one or more computing devices or systems to specifically configure those computing devices/systems to perform the specific operations of the illustrative embodiments, or an embodiment containing both hardware and software elements. In one example embodiment, the mechanisms of the illustrative embodiments are implemented in software or program code, which includes but is not limited to firmware, resident software, microcode, etc. with this software or program code being executed in the one or more computing devices/systems to specifically configure those computing devices/systems to be special purpose computing devices/ systems that are specifically configured to perform the operations of one or more illustrative embodiments as described previously.

A data processing system suitable for storing and/or executing program code will include at least one processor coupled directly or indirectly to memory elements through a communication bus, such as a system bus, for example. The memory elements can include local memory employed during actual execution of the program code, bulk storage, and cache memories which provide temporary storage of at least some program code in order to reduce the number of times code must be retrieved from bulk storage during execution. The memory may be of various types including, but not limited to, ROM, PROM, EPROM, EEPROM, DRAM, SRAM, Flash memory, solid state memory, and the like.

Input/output or I/O devices (including but not limited to keyboards, displays, pointing devices, etc.) can be coupled to the system either directly or through intervening wired or wireless I/O interfaces and/or controllers, or the like. I/O devices may take many different forms other than conventional keyboards, displays, pointing devices, and the like, such as for example communication devices coupled through wired or wireless connections including, but not limited to, smart phones, tablet computers, touch screen devices, voice recognition devices, and the like. Any known or later developed I/O device is intended to be within the scope of the illustrative embodiments.

Network adapters may also be coupled to the system to enable the data processing system to become coupled to other data processing systems or remote printers or storage devices through intervening private or public networks. Modems, cable modems and Ethernet cards are just a few of the currently available types of network adapters for wired communications. Wireless communication based network adapters may also be utilized including, but not limited to, 802.11 a/b/g/n wireless communication adapters, Bluetooth wireless adapters, and the like. Any known or later developed network adapters are intended to be within the spirit and scope of the present invention.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments.

The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system, comprising:

parsing, by a logic synthesis engine executing in the data processing system, an integrated (IC) device design data structure specifying an IC device design, to identify at least one instance of an obfuscation indicator in the IC device design data structure, wherein the obfuscation indicator identifies a corresponding IC logic element whose state is to be non-discoverable;

marking, by the logic synthesis engine, at least one IC logic element, in the IC device design, which is associated with the at least one instance of the obfuscation indicator;

selecting, by an emission obfuscation optimization engine executing in the data processing system, at least one emission obfuscation optimization to enable for application to the marked at least one IC logic element, wherein the selection enables one or more emission obfuscation optimizations based on design constraints of the IC device design, a configuration of logic elements and pathways of the IC device design, and emission obfuscation requirements for the at least one IC logic element, the at least one emission obfuscation optimization including replacing at least one target IC logic element having a first voltage threshold that produces a first emissions with at least one replacement IC logic element having a second voltage threshold that produces a second emissions that is lower than the first emissions;

automatically applying, by the emission obfuscation optimization engine executing in the data processing system, the at least one emission obfuscation optimization to the marked at least one IC logic element by relocating the marked at least one IC logic element to a high density region of the IC device design, to modify the IC device design obfuscate emissions from a marked at least one IC device design data structure specifying the modified IC device design;

outputting, by the data processing system, the emissions obfuscated IC device design data structure to a fabrication tool configured to fabricate a physical IC device; and fabricating, by the fabrication tool, the physical IC device based on the emissions obfuscated IC device design data structure, the physical IC device including at least one physical IC logic element having the at least one emission obfuscation optimization that corresponds to the marked at least one IC logic element.

2. The method of claim 1, wherein automatically applying the at least one emission obfuscation optimization to the marked at least one IC logic element comprises relocating the marked at least one IC logic element to a region of the IC device design having relatively larger IC elements providing masking emissions.

3. The method of claim 1, wherein automatically applying at the least one emission obfuscation optimization to the marked at least one IC logic element comprises redesigning the marked at least one IC logic element to have a relatively higher threshold voltage.

4. The method of claim 1, wherein automatically applying the at least one emission obfuscation optimization to the marked at least one IC logic element comprises redesigning the marked at least one IC logic element to reduce state dependent emission signature changes in an operation of the marked at least one IC logic element.

5. The method of claim 1, wherein automatically applying the at least one emission obfuscation optimization to the marked at least one IC logic element comprises at least two different emission obfuscation optimizations selected from a set consisting essentially of:

relocating the marked at least one IC logic element to the high density region of the IC device design;

relocating the marked at least one IC logic element to a region of the IC device design having relatively larger IC elements providing masking emissions; and redesigning the marked at least one IC logic element to have a relatively higher threshold voltage.

6. The method of claim 1, wherein parsing the IC device design data structure to identify the least one instance of an obfuscation indicator in data of the IC device design data structure comprises identifying hardware description language text specifying a secret key pathway in the IC device design, wherein the marked at least one IC logic element is a set of gates along a secure key pathway from an on-chip secure key storage to a locked block of the IC device design, and wherein at least one of the gates is included among the least one target IC logic element having the first voltage threshold that produces the first emissions and is replaced with at least one replacement gate having the second voltage threshold that produces the second emissions that is lower than the first emissions.

7. The method of claim 1, wherein the at least one emission obfuscation optimization comprises at least one of adding additional logic elements to the IC device design to obfuscate emissions of the at least one IC logic element while abiding by the design constraints, rearranging existing logic elements in the IC design device to obfuscate emissions of the at least one IC logic element while abiding by the design constraints, redesigning the at least one IC logic element to have a modified operational characteristic that reduces emissions of the at least one IC logic element while abiding by the design constraints, or modifying placement of the existing logic elements and pathways in the IC device design so as to obfuscate emissions of the at least one IC logic element while abiding by the design constraints.

8. The method of claim 1, wherein the constraints comprising timing constraints, power consumption constraints, and area constraints for the marked logic elements and other non-marked elements/pathways of the IC design, analyzed in combination with emissions obfuscation requirements of the marked at least one IC logic element.

9. The method of claim 1, wherein:

selecting the at least one emission obfuscation optimization comprises selecting a number of emission obfuscation optimizations based on a desired level of security of the marked IC elements, a first level of security, higher than a second level of security, has a first number of enabled emission obfuscation optimizations and the second level of security has a second number of enabled emission obfuscations, and the first number is greater than the second number.

10. A computer program product comprising a computer readable storage medium having a computer readable program stored therein, wherein the computer readable program, when executed on a data processing system, causes the data processing system to:

parse, by a logic synthesis engine executing in the data processing system, an integrated circuit (IC) device design data structure specifying an IC device design, to identify at least one instance of an obfuscation indicator in the IC device design data structure, and wherein the obfuscation indicator identifies a corresponding IC logic element of those who state is to be non-discoverable;

mark, by the logic synthesis engine, at least one IC logic element, in the IC device design, which is associated with the at least one instance of the obfuscation indicator;

select, by an emission obfuscation optimization engine executing in the data processing system, at least one emission obfuscation optimization to enable for application to the marked at least one IC logic element, wherein the selection enables one or more emission obfuscation optimizations based on design constraints of the IC device design, a configuration of logic elements and pathways of the IC device design, and emission obfuscation requirements for the at least one IC logic element, the at least one emission obfuscation optimization including replacing at least one target IC logic element having a first voltage threshold that produces a first emissions with at least one replacement IC logic element having a second voltage threshold that produces a second emissions that is lower than the first emissions;

automatically apply, by the emission obfuscation optimization engine in the data processing system, the at least one emission obfuscation optimization to the marked at least one IC logic element by relocating the marked at least one IC logic element to a high density region of the IC device design, to modify the IC device design to obfuscate emissions from the marked at least one IC logic element, and generate an emissions obfuscated IC device design data structure specifying the modified IC device;

output, by the data processing system, the emissions obfuscated IC device design data structure to a fabrication tool configured to fabricate a physical IC device in accordance with the emissions obfuscated IC device; and fabricate, by the fabrication tool, the physical IC device based on the emissions obfuscated IC device design data structure, the physical IC device including at least one physical IC logic element having the at least one emission obfuscation optimization that corresponds to the marked at least one IC logic element.

11. The computer program product of claim 10, wherein automatically applying the at least one emission obfuscation optimization to the marked at least one IC logic element comprises relocating the marked at least one IC logic element to a region of the IC device design having relatively larger IC elements providing masking emissions.

12. The computer program product of claim 10, wherein automatically applying the at least one emission obfuscation optimization to the marked at least one IC logic element comprises redesigning the marked at least one IC logic element to have a relatively higher threshold voltage.

13. The computer program product of claim 10, wherein automatically applying the at least one emission obfuscation optimization to the marked at least one IC logic element comprises redesigning the marked at least one IC logic element to reduce state dependent emission signature changes in an operation of the marked at least one IC logic element.

14. The computer program product of claim 10, wherein automatically applying the at least one emission obfuscation optimization to the marked at least one IC logic element comprises at least two different emission obfuscation optimizations selected from a set consisting essentially of:

relocating the marked at least one IC logic element to a high density region of the IC device design;

relocating the marked at least one IC logic element to a region of the IC device design having relatively larger IC elements providing masking emissions; and redesigning the marked at least one IC logic element to have a relatively higher threshold voltage.

15. The computer program product of claim 10, wherein parsing the IC device design data structure to identify the at least one instance of an obfuscation indicator in data of the IC device design data structure comprises identifying hardware description language text specifying a secret key pathway in the IC device design, wherein the marked at least one IC logic element is a set of gates along a secure key pathway from an on-chip secure key storage to a locked logic block of the IC device design, and wherein at least one of the gates is included among the least one target IC logic element having the first voltage threshold that produces the first emissions and is replaced with at least one replacement gate having the second voltage threshold that produces the second emissions that is lower than the first emissions.

16. The computer program product of claim 10, wherein the computer readable program further causes the data processing system to:

fabricate the IC device in accordance with the emissions obfuscated IC device design data structure, wherein emissions from IC device elements corresponding to the marked at least one IC logic element are obfuscated against emissions based side channel detection techniques.

* * * * *